(12) United States Patent
Aqui et al.

(10) Patent No.: US 8,173,473 B2
(45) Date of Patent: *May 8, 2012

(54) LASER SYSTEM FOR PROCESSING SOLAR WAFERS IN A CARRIER

(75) Inventors: Derek Aqui, Portland, OR (US); Steven M. Zuniga, Soquel, CA (US); Venkateswaran Subbaraman, San Jose, CA (US); Kirk Liebscher, San Jose, CA (US); John Alexander, San Jose, CA (US); Zhenhua Zhang, Newark, CA (US); Virendra V. S. Rana, Los Gatos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/891,525

(22) Filed: Sep. 27, 2010

(65) Prior Publication Data

US 2011/0076847 A1 Mar. 31, 2011

Related U.S. Application Data

(60) Provisional application No. 61/246,865, filed on Sep. 29, 2009.

(51) Int. Cl.
*H01L 21/00* (2006.01)
(52) U.S. Cl. ......... 438/55; 438/535; 438/662; 257/618

(58) Field of Classification Search ............ 438/55, 438/535, 662
See application file for complete search history.

(56) References Cited

U.S. PATENT DOCUMENTS

| 2009/0162972 A1 | 6/2009 | Xu et al. |
| 2010/0055901 A1* | 3/2010 | Zhang et al. ............ 438/669 |
| 2010/0087028 A1* | 4/2010 | Porthouse et al. ........... 438/61 |

FOREIGN PATENT DOCUMENTS

| JP | 06-140570 A | 5/1994 |
| JP | 2001-250966 A | 9/2001 |
| JP | 2003-168645 A | 6/2003 |
| JP | 2004-303766 A | 10/2004 |

OTHER PUBLICATIONS

International Search Report and Written Opinion dated Jun. 8, 2011 for International Application No. PCT/US2010/050414.

* cited by examiner

*Primary Examiner* — Jarrett Stark
*Assistant Examiner* — Nicholas Tobergte
(74) *Attorney, Agent, or Firm* — Patterson & Sheridan, LLP

(57) ABSTRACT

An apparatus and method for processing the solar cell substrates is provided. In one embodiment, a laser firing chamber for processing solar cell substrates placed in a carrier, comprising a laser module located at a side of the carrier, the laser module being adapted to generate and direct multiple laser beams over an entire surface of a plurality of solar cell substrates, and a transport adapted to convey the carrier through an outputting region of the laser beams.

20 Claims, 22 Drawing Sheets

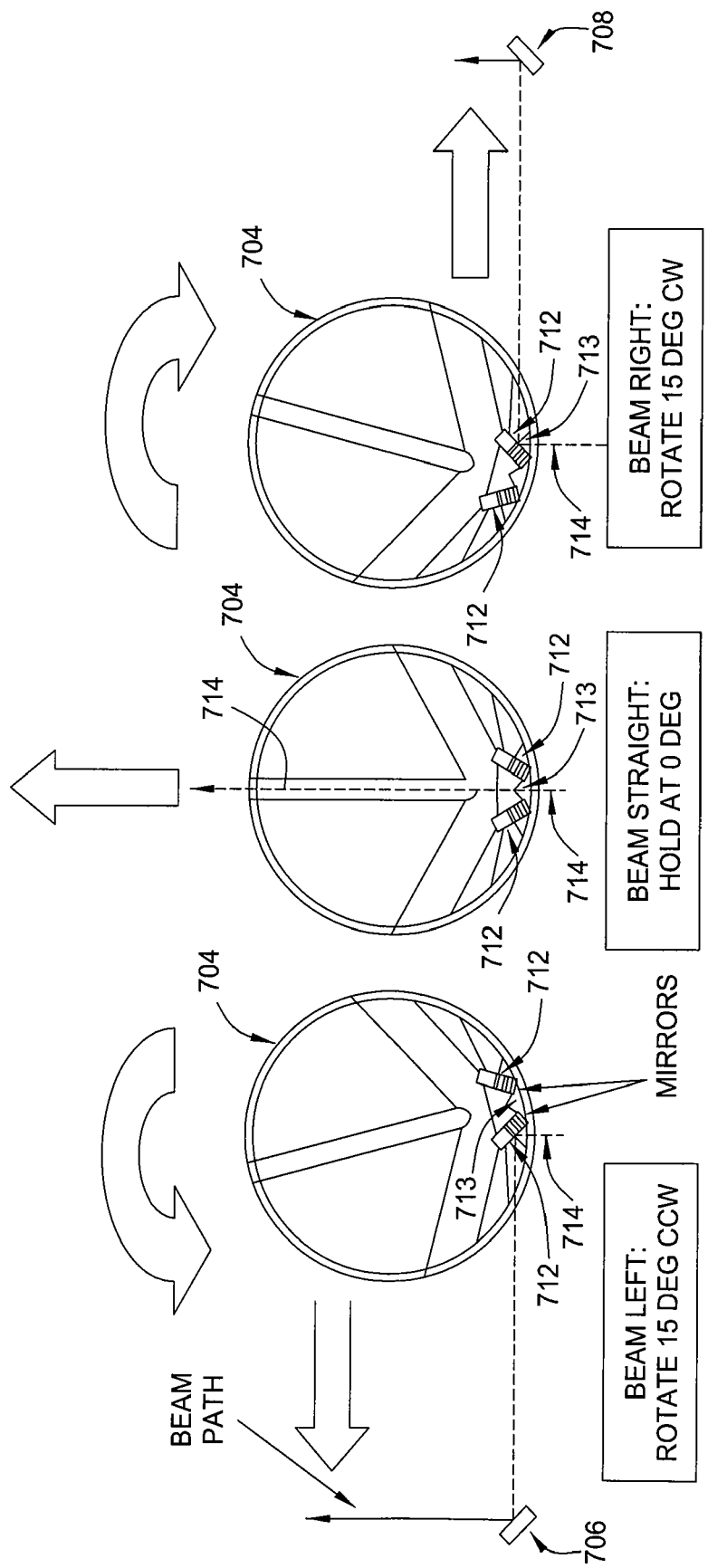

LASER SYSTEM FOR PROCESSING SOLAR WAFERS IN A CARRIER

CROSS-REFERENCE TO RELATED APPLICATIONS

This application claims benefit of U.S. provisional patent application Ser. No. 61/246,865, filed Sep. 29, 2009, which is incorporated by reference herein.

BACKGROUND

1. Field of the Invention

Embodiments of the present invention generally relate to the processing of photovoltaic cells. In particular, embodiments of the present invention relate to apparatus and method for laser ablation of portions of material layers from a side of the photovoltaic cell.

2. Description of the Related Art

Photovoltaic (PV) devices or solar cells are devices converting sunlight and other light into electrical energy. Usually solar cells consist of a semiconductor material—mostly manufactured from silicon that has n-doped or p-doped semiconductor regions. The most common solar cell material is silicon, which is in the form of single crystal, polycrystalline or multicrystalline substrates, sometimes referred to as wafers. Solar cells may be tiled into larger solar arrays. The solar arrays are created by connecting a number of solar cells and joining them into panels with specific frames and connectors. Because the amortized cost of forming silicon-based solar cells to generate electricity is higher than the cost of generating electricity using traditional methods, there has been an effort to reduce the cost to form solar cells.

A crystalline solar cells generally includes a plurality of conductive and dielectric materials deposited on a substrate to form solar cell devices. Since crystalline solar cell substrates are generally quite thin, it is thermo-mechanically advantageous to include a passivating layer between the rear surface aluminum electrode layer and the silicon substrate. In order to increase cell efficiency, various approaches, such as laser-fired contacts (LFC) have been proposed as an ideal manner to realize contact holes for a passivated rear surface by driving the aluminum through the passivating layer several microns deep into the silicon substrate, thereby creating a localized Al/Si alloy contacts without severe damage to the passivating layer.

However, the laser system that accomplish LFC process are typically stand-alone systems that require additional substrate handling steps to transfer the solar cell substrates from a different processing system to the laser system. Since the thickness of the solar cell substrate are getting extremely thin and fragile, any additional handling steps are usually not desirable in order to minimize a breakage rate in association with each substrate handling step.

Therefore, there is a need for improved laser ablating process and apparatus for removing material from solar cell substrates without any additional substrate handling steps.

SUMMARY OF THE INVENTION

An apparatus and method for processing the solar cell substrates is provided. In one embodiment of the present invention, a laser firing chamber for processing solar cell substrates placed in a carrier comprises a laser module located at a side of the carrier, the laser module being adapted to generate and direct multiple laser beams over an entire surface of a plurality of solar cell substrates, and a transport adapted to convey the carrier through an outputting region of the laser beams.

In another embodiment of the present invention, an processing system for processing solar cell substrates comprises an evaporation chamber for depositing a first layer on a side of the pre-treated solar cell substrate, a deposition chamber for depositing a second layer on the side of the solar cell substrates, a laser firing chamber having a laser module adapted to deliver an amount of energy over an entire surface of a plurality of solar cell substrates, and a transport system for conveying the plurality of solar cell substrates through the evaporation chamber, the deposition chamber, and the laser firing chamber.

In one another embodiment of the present invention, a processing system for processing solar cell substrates comprises a first substrate handling system configured to transfer one or more solar cell substrate from an input region to a substrate pocket, a laser processing system having a laser module adapted to deliver an amount of energy over an entire surface of one or more solar cell substrates, a transfer robot configured to transfer the one or more solar cell substrates from the substrate handling system through the laser processing system to a carrier, an automation system configured to transport a plurality of processed solar cell substrates that are placed in the carrier into a deposition system having at least one depositing chamber that is configured to deposit one or more layers on a side of the solar cell substrates, and a second substrate handling system configured to transfer the plurality of processed solar cell substrate from the deposition system to an exit region.

In yet another embodiment, a method for processing silicon-containing substrates in a processing system comprises transferring a plurality of silicon-containing substrates having a dielectric layer deposited thereon through a depositing chamber to evaporate a conducting layer over the dielectric layer, transferring the plurality of silicon-containing substrates having the dielectric layer and the conducting layer deposited thereon through a laser firing chamber to process the plurality of silicon-containing substrates by directing multiple laser beams over the entire surface of the plurality of silicon-containing substrates simultaneously in a desired pattern, thereby diffusing the conducting layer through the dielectric layer into the silicon-containing substrates.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 6a illustrates a top view of a laser module adapting a concept of beam switching method according to one embodiment of the present invention.

FIG. 6b illustrates a prospective and enlarged view of an annular mirror/window assembly shown in FIG. 6a.

FIGS. 7a, 7b, and 7c depict enlarged views of the switching mirror assembly of FIG. 7, showing a simplified switching mirror assembly in a different position.

For clarity, identical reference numerals have been used, where applicable, to designate identical elements that are common between figures. It is contemplated that features of one embodiment may be incorporated in other embodiments without further recitation.

DETAILED DESCRIPTION

The following description sets forth numerous specific details such as examples of specific chambers, components, methods, and so forth, in order to provide a good understanding of several embodiments of the present invention. It will be apparent to one skilled in the art that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

Embodiments of the present invention relate to an apparatus and a method for laser ablating portions of one or more material layers from a side of the photovoltaic cell. In one embodiment, a processing system is provided that removes portions of a dielectric layer deposited on a solar cell substrate according to a desired pattern. In one embodiment, a movable laser module is provided to process films from a backside of a solar cell substrate while a solar cell substrate disposed in a carrier is translated. In one embodiment, an in-line processing system having at least an evaporation chamber, a laser firing chamber, and a deposition chamber is provided in which a plurality of solar cell substrates are processed by a laser module without breaking vacuum. In one embodiment, a method for processing a side of the solar cell substrates while conveying the processed solar cell substrates through multiple processing chambers in an in-line processing system is provided.

Figure 1A:
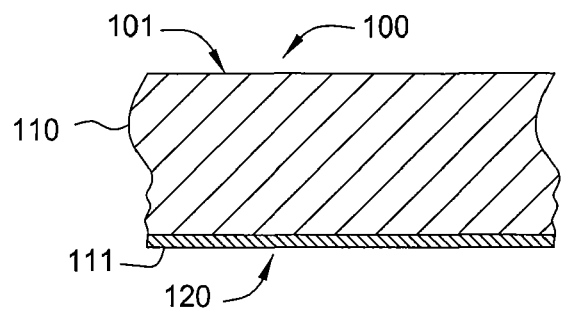
FIGS. 1a-1d are schematic cross-sectional views of a solar cell substrate during different stages of processing according to embodiments of the invention.

FIGS. 1a-1e illustrate schematic cross-sectional views of a solar cell substrate 110 during different stages of a processing sequence used to form a contact structure on a surface of a solar cell 100. FIG. 1a illustrates a solar cell 100 having a substrate 110, a front surface 101, and a back surface 120. In one embodiment, the substrate 110 comprises a p-type silicon layer, an n-type silicon layer, and an intrinsic type (i-type) silicon layer may optionally sandwiched between the p-type and n-type silicon layers. Several types of silicon substrates including single crystal silicon, multicrystalline, or polycrystalline silicon (poly-Si), and the like may be utilized to form part of the solar cell device. The deposited p-type, n-type, and/or i-type layers formed on the substrate 110 surface can generally be amorphous silicon (a-Si), poly crystalline or microcrystalline (µc). In other embodiments, the substrate 110 may comprise organic material, germanium (Ge), gallium arsenide (GaAs), cadmium telluride (CdTe), cadmium sulfide (CdS), copper indium gallium selenide (CIGS), copper indium selenide (CuInSe$_2$), or gallium indium phosphide (GaInP$_2$) as well as heterojunction cells, such as GaInP/GaAs/Ge or ZnSe/GaAs/Ge, that are used to convert sunlight to electrical power.

As the solar cell substrates become thinner in order to reduce the solar cell material cost and improve cell efficiency, it is thermo-mechanically advantageous to deposit a passivating layer or a dielectric layer 111 on the back surface 120 of the substrate 110, as shown in FIG. 1a. In one aspect, the backside dielectric layer 111 is a silicon oxide layer, such as a silicon dioxide layer, formed on the surface 120 of a silicon containing substrate. In another aspect, the dielectric layer 111 is a silicon nitride layer, a silicon oxynitride layer, a silicon carbide layer, a silicon oxycarbide layer, or other similar type of layer. The dielectric layer 111 may be formed using a conventional oxidation process, such as a furnace annealing process, a rapid thermal oxidation process, an atmospheric pressure or low pressure chemical vapor deposition (CVD) process, a plasma enhanced CVD process, a physical vapor deposition (PVD) process (sputter-deposition, evaporation, etc.), a spray-on process, a spin-on process, a roll-on process, a screen printing process, or another similar deposition process.

Figure 1B:
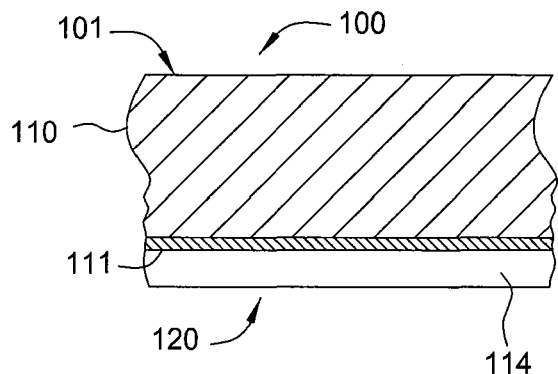
Figure 1C:
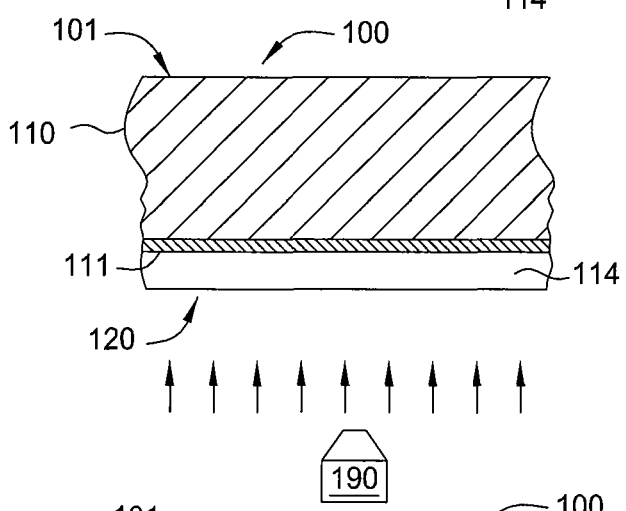

After deposition of the dielectric layer 111, a conducting layer or so-called back metal layer 114 is deposited over the dielectric layer 111 on the back surface 120 of the substrate 110, as shown in FIG. 1b. In one embodiment, the formed conducting layer 114 is between about 500 Å and about 500,000 Å thick and contains a metal, such as copper (Cu), silver (Ag), tin (Sn), cobalt (Co), rhenium (Rh), nickel (Ni), zinc (Zn), lead (Pb), and/or aluminum (Al). In one embodiment, the conducting layer 114 is an aluminum (Al) layer formed by a PVD process. In one embodiment, the aluminum conducting layer 114 is formed by evaporation process, i.e., the aluminum source may be evaporated upwardly to the backside of the substrate 110. In one embodiment, the conducting layer 114 may includes two layers that are formed by first depositing an aluminum (Al) layer by a PVD process (sputter-deposition, evaporation, etc.), and then depositing a nickel vanadium (NiV) capping layer by a PVD process. It is contemplated that aluminum conducting layer may be formed by other conventional methods such as a screen-printing metallization process.

In order to form an electrical connection, or regions 125, between the conducting layer 114 and the surface 110A of the substrate 110, one or more laser devices 190 are adapted to deliver energy to drive portions of the conducting layer 114 through the dielectric layer 111. In one embodiment, after forming the regions 125, the substrate is heated to a temperature between about 300° C. and about 800° C. for between about 1 minute and about 30 minutes to assure that a good ohmic contact is formed. Therefore, the conducting layer 114 is electrically connected to the substrate 110 through the regions 125 on the back surface 120 of the substrate 110. In one embodiment, the laser device 190 is a solid state laser, such as Nd:YAG laser, Nd:YVO$_4$ laser, a fiber laser, or any other suitable laser. In one embodiment, a q-switched, flash pumped Nd:YAG laser source emitting at 1064 nm or 532 nm in TEM$_{00}$ mode is used.

Figure 1D:
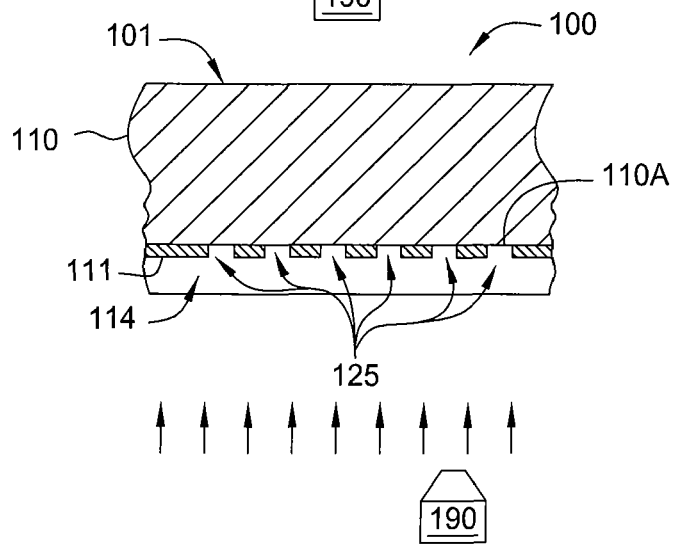
Figure 1E:
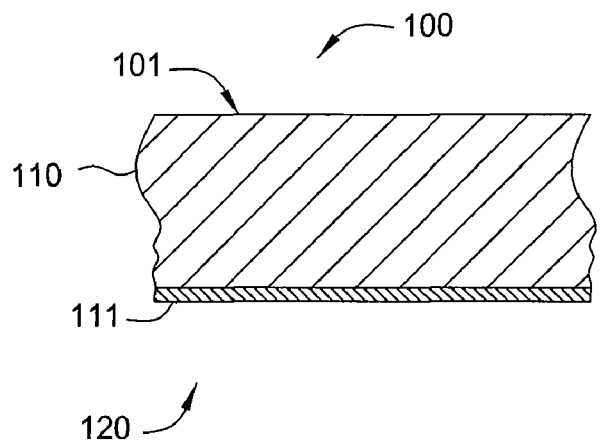
FIGS. 1e-1g are schematic cross-sectional views of a solar cell substrate during different stages of processing according to embodiments of the invention.
Figure 1F:
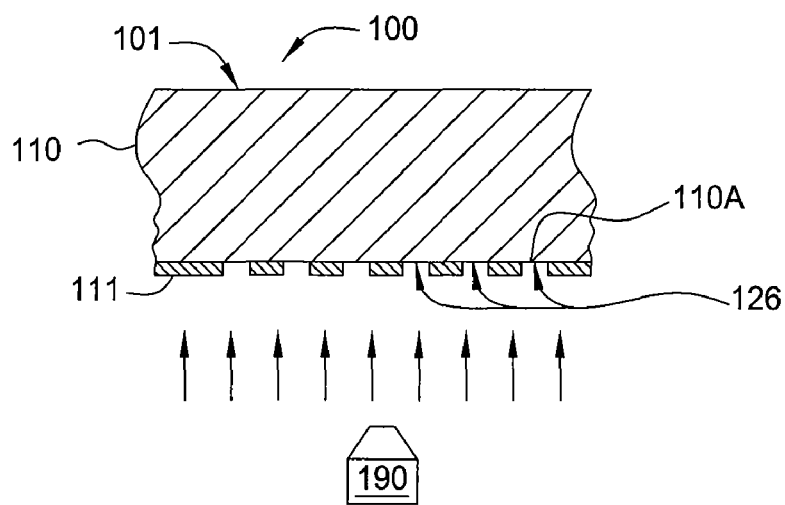
Figure 1G:
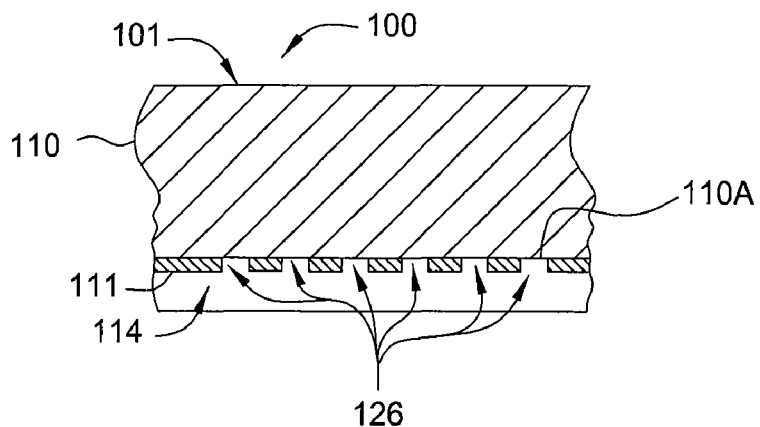

In an alternate embodiment of the processing sequence illustrated in FIGS. 1a-1d, the processing sequence includes the steps shown in FIGS. 1e-1g. In this processing configuration after depositing the dielectric layer 111 on the back surface 120 of the substrate 110, as shown in FIG. 1e and similar to the steps discussed in conjunction with FIG. 1a, the laser device is used to pattern the dielectric layer 111 to form one or more exposed regions 126 (FIG. 1f). Methods for removing the dielectric layer using one or more lasers are subsequently described in the section entitled "Laser Removal Methods." Following the removal of regions of the dielectric layer 111, a conducting layer 114 is deposited over the back surface 120 of the substrate 110, as shown in FIG. 1g. Additionally, it may be further desirable to heat the substrate to a desired temperature to assure that the conducting layer 114 is in good electrical contact with the back surface 120 of the substrate 110. In one embodiment, the substrate is heated to a temperature between about 300° C. and about 800° C. for between about 1 minute and about 30 minutes to form a good ohmic contact. Therefore, a similar structure to the device shown in FIG. 1d is formed, which has an electrical connection formed between the substrate surface 110A and the conducting layer 114 through the exposed regions 126.

Thereafter, various processing steps may be performed to prepare and/or texture the front surface 101 of the substrate to improve light absorption. In one embodiment, the front surface 101 is prepared to receive sunlight after the solar cell has been formed. Alternatively, the preparation of the front surface 101 may be performed prior to depositing the dielectric layer 111. In one embodiment, the front surface 101 is textured and then selectively doped using either a spray-on or a vapor phase, high temperature diffusion process. The front surface 101 then may be passivated by depositing an antireflection (ARC) layer. In a heterojunction type solar cell structure, one or more active layers (e.g., i-n type layer on a p-type substrate) may be formed on the textured front surface 101. In one embodiment, after preparing the front surface 101, one or more conductive front metal lines (not shown) may be formed thereon using conventional processes to form a front contact structure of the solar cell 100. The front metal structure may include, but is not limited to a material selected from aluminum (Al), silver (Ag), titanium (Ti), chrome (Cr), gold (Au), copper (Cu), and platinum (Pt), alloys thereof, and combinations thereof. It is contemplated that the production process described here is simplified and various processing steps, post-treating processes such as annealing, edge material removal, or testing processes, that may be performed in this processing system are not shown. FIGS. 1a-1g are only intended to illustrate some of the various aspects of the invention and are not intended to be limiting as to the type of structure or processing sequence that may be formed using the various embodiments of the invention described herein.

Laser Removal Methods

As previously presented, the removal of portions of material layers (e.g., dielectric layer 111 or conducting layer 114) may be achieved by the use of a laser device 190. Typically, the material ablation is conducted by pulsing the laser device 190 at a specific frequency, wavelength, pulse duration, and fluence at a specific spot on the substrate 110 to achieve complete evaporation of the material layer. However, it is difficult to achieve complete evaporation of a portion of a material layer, particularly the dielectric layer 111, without damaging the underlying substrate 110.

One reason for the difficulty in removing a portion of the dielectric layer 111 without damaging the substrate 110 is due to the variation in intensity across the area of the laser spot being focused on the substrate 110. In an ideal laser that emits a beam with a pure Gaussian profile (i.e., operating on the fundamental transverse or TEM$_{00}$ mode), the peak intensity at the center of a desired spot on the material to be removed is higher than around the periphery of the spot. Please refer to FIG. 15, it is a schematic depiction of the laser device 190 propagating a beam 1500 along a distance Z from the laser device 190. FIG. 16 is a schematic illustration of the Gaussian intensity profile of the beam 1500 at the point 1510 in FIG. 15. FIG. 17 is a schematic illustration of the Gaussian intensity profile of the beam 1500 at the point 1520 in FIG. 15.

Figure 15:
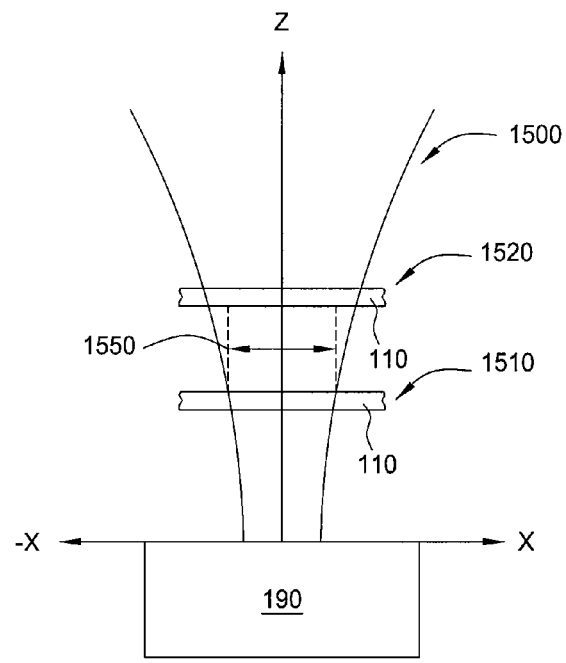
FIG. 15 is a schematic depiction of a laser propagating a beam along a distance from the laser.
Figures 16, 17:
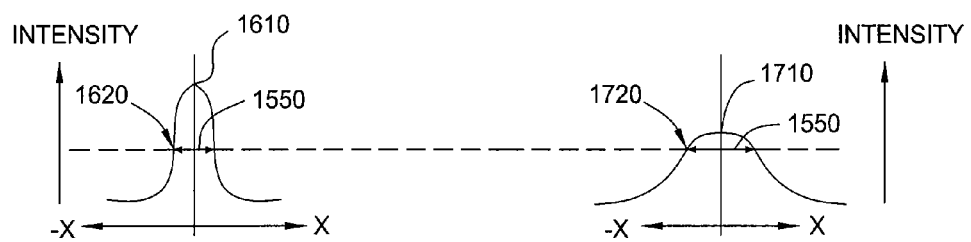
FIG. 16 is a schematic illustration of the Gaussian intensity profile of the beam at a specified position shown in FIG. 15.
FIG. 17 is a schematic illustration of the Gaussian intensity profile of the beam at an adjusted position shown in FIG. 15 according to one embodiment of the present invention.

Referring to FIGS. 15 and 16, the point 1510 on the beam 1500 represents a typical "in focus" positioning of the substrate 110 with respect to the laser device 190, in order to achieve complete evaporation of the dielectric layer 111 across a desired spot 1550. As can be seen, the peak intensity 1610 at the center of the spot 1550 is significantly higher than the peripheral intensity 1620 at the periphery of the spot 1550 because the periphery of the spot 1550 must be set at the ablation threshold of the material of the dielectric layer 111. Thus, although the peripheral intensity 1620 is just high enough to achieve ablation of the dielectric layer 111 along the periphery of the spot 1550, the significantly high peak intensity causes damage to the underlying substrate 110 at the center of the spot 1550.

In one embodiment of the present invention, complete removal of the dielectric layer 111 across the desired spot 1550 without damaging the substrate 110 is achieved by defocusing the beam 1500 intensity profile delivered to the dielectric layer 111 by, for example, adjusting the position of the substrate 110 relative to the beam 1500. In one example, as shown in FIG. 15, the substrate 110 is moved from a position where the beam is more in focus (e.g., point 1510) to a position being more out of focus (e.g., point 1520). Referring to FIGS. 15 and 16, it can be seen that the peak intensity 1710 at the center of the spot 1550 is just slightly higher than the peripheral intensity 1720 along the periphery of the spot 1550. Because the peak intensity 1710 is significantly lower due to the defocusing of the laser device 190 (i.e., positioning the substrate 110 out of the normal focus region of the beam 1500), complete ablation of the dielectric layer 111 within the desired spot 1550 is removed without causing damage to the underlying substrate 110. Further, although the beam 1500 is emitted on a region of the substrate 110 that is larger than the desired size of the spot 1550, only the portion of the dielectric layer 111 within the spot 1550 is removed because the peripheral intensity 1720 is just high enough to achieve ablation of the dielectric layer 111 along the periphery of the spot 1550. Any area of the dielectric layer 111 that receives the beam 1500 below this threshold is not removed.

In another embodiment, certain optical components (e.g., lenses and beam expanders) are manipulated in order to modify the beam 1500 such that a Gaussian intensity distribution similar to that shown in FIG. 17 is achieved without defocusing the laser device 190. Similarly, complete removal of the dielectric layer 111 is removed within the desired spot 1550 without causing damage to the underlying substrate 110 because the peak intensity is only slightly higher than the peripheral intensity about the periphery of the spot 1550.

Another reason for the difficulty in removing a desired portion of the dielectric layer 111 without damaging the substrate 110 is due to the high pulse energy required to evaporate the dielectric material. In one embodiment of the present invention, significantly lower pulse energies are used to thermally stress and cause physically lift off of the desired region of the dielectric layer 111 rather than evaporating it.

Figure 18:
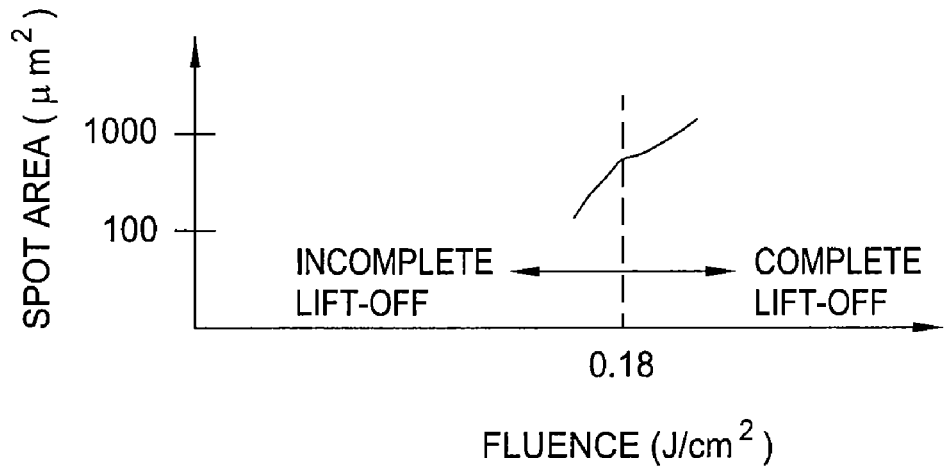
FIG. 18 is a schematic illustration of one example of laser removal caused by thermal stress and physical lift off of a thermally grown oxide according to one embodiment of the present invention.

FIG. 18 is a schematic illustration of one example of laser removal caused by thermal stress and physical lift off of a thermally grown oxide. In one embodiment, the dielectric layer 111 is a silicon oxide having a thickness between about 1000 Å and about 3000 Å thermally grown on the substrate 110. In one embodiment, thermal stress and physical lift off was achieved by the laser device 190 using a pulse duration of from about 10 picoseconds and about 15 picoseconds and a wavelength of about 355 nm. The laser fluence required for complete physical lift off of a spot of the dielectric layer 111 was about 0.18 J/cm$^2$. In this example, any lower fluence did not achieve complete lift off and significantly higher fluence caused damage to the underlying substrate 110.

Figure 19:
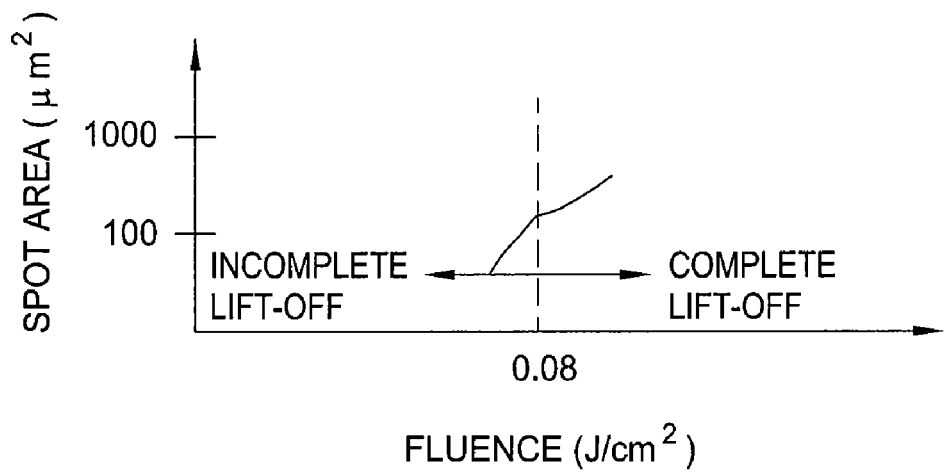
FIG. 19 is a schematic illustration of one example of laser removal caused by thermal stress and physical lift off of a silicon oxide deposited by plasma enhanced chemical vapor deposition (PECVD) according to one embodiment of the present invention.

FIG. 19 is a schematic illustration of one example of laser removal caused by thermal stress and physical lift off of a silicon oxide deposited by plasma enhanced chemical vapor deposition (PECVD). In one embodiment, the dielectric layer 111 is a silicon oxide having a thickness between about 1000 Å and about 3000 Å deposited by PECVD on the substrate 110. In one embodiment, thermal stress and physical lift off was achieved by the laser device 190 using a pulse duration of from about 10 picoseconds and about 15 picoseconds and a wavelength of about 355 nm. The laser fluence required for complete physical lift off of a spot of the dielectric layer 111 was about 0.08 J/cm$^2$. In this example, any lower fluence did not achieve complete lift off and significantly higher fluence caused damage to the underlying substrate 110. It should be noted that the laser removal methods as described here may be done in either a vacuum or atmospheric environment.

Integrated Processing System with Laser Firing Chamber

Referring back to FIG. 2, which is a simplified diagram of one example processing system 200 for practicing the present invention. In one embodiment, the processing system 200 is a horizontal in-line deposition system designed for high throughput which matches the production line scale of modern PV manufacturing plants. One suitable processing system may be utilized to practice the present invention is an ATON™ tool available from Applied Materials, Inc., located in Santa Clara, Calif. For example, ATON™ 500 EvSp chamber or ATON™ 1600 series (i.e., 1600 mm coating width). Although the invention is specifically described with respect to a particular system configuration, it is understood that the invention is applicable in a variety of configurations and designs and can be applied to other processing system.

Figure 4:
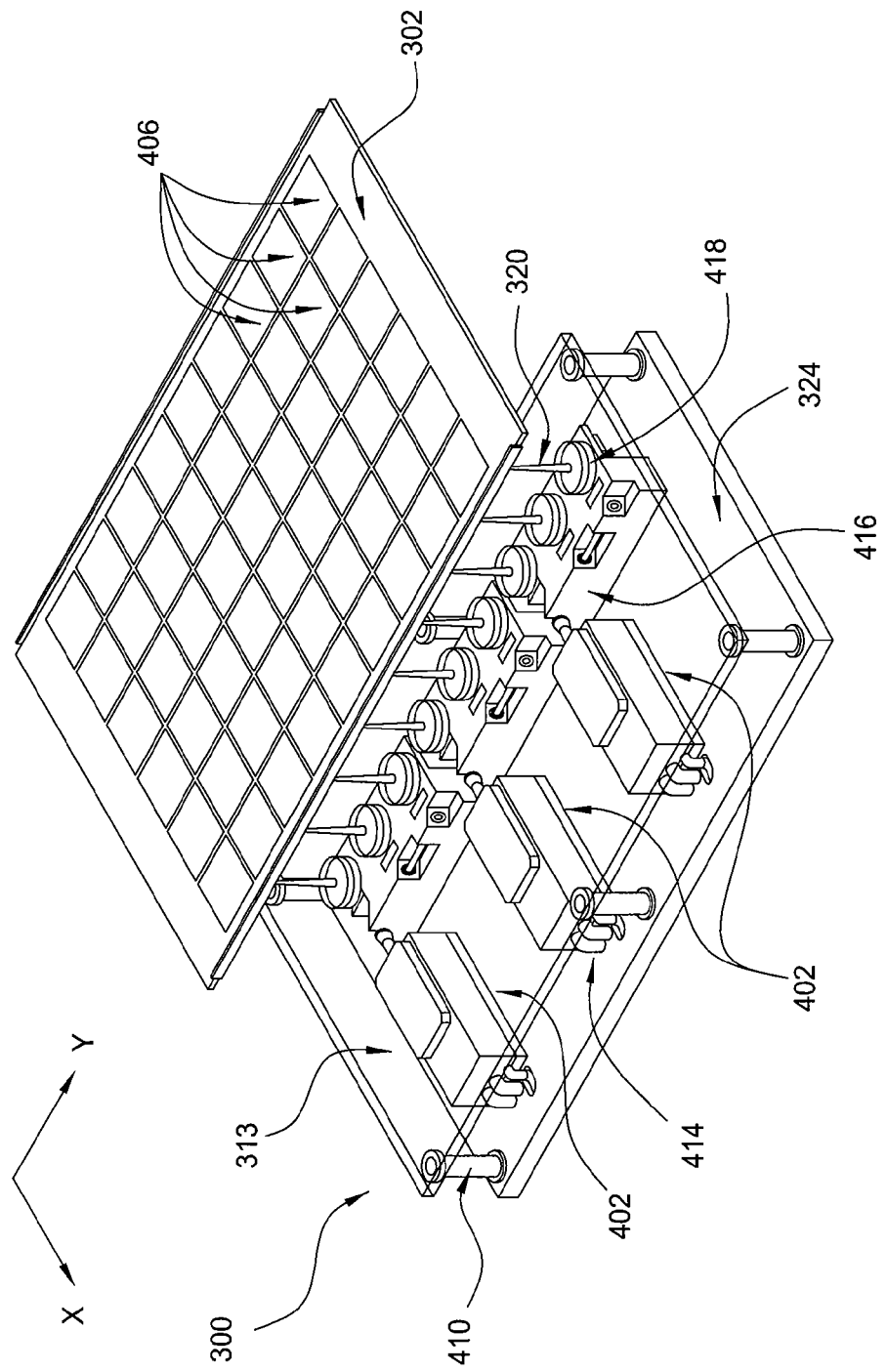
FIG. 4 illustrates a schematic diagram of a laser module according to one embodiment of the present invention.

The processing system 200 may generally have a number of processing chambers that are able to perform different processing steps in a processing sequence used to form an interconnect structure on a surface of a solar cell substrate. In one embodiment, the processing system 200 generally contains an input region 202, an evaporation region 204, a laser firing region 206, a sputtering region 208, and an output region 210. Prior to the input region 202, the solar cell substrates may be manually or automatically delivered to a loading area (e.g., reference numeral 1220 in FIG. 12) found in a carrier, cassette or wafer box. In one embodiment, the carrier is a grid-like frame body and is designed to support the solar cell substrates. An example of carrier is illustrated in FIG. 4, which is labeled reference numeral 302. In one configuration, the front and back surfaces of the substrates disposed in the carrier are unobstructed to allow a laser module, which is located above and/or below the carrier, to process the solar cell substrates. In one embodiment, the carrier may be a shallow U-shaped plate that is adapted to any substrate size. In one embodiment, the carrier is able to accommodate a plurality of solar cell substrates having different size. In one example, the solar cell substrate is about 156 mm×156 mm×3 mm in size. In another example, the solar cell substrate is about 180 mm×180 mm×3 mm in size. In one embodiment, the carrier is designed to accommodate a rectangular array of substrates. In one example, fifty four solar cell substrates, for example, nine solar cell substrates in the transverse (Y) direction by six solar cell substrates in the longitudinal (X) direction, are placed in the carrier. The carrier may contain materials such as aluminum, carbon-fiber or other suitable materials so that the carrier, when loading with a plurality of solar cell substrates, has a minimum deflection (e.g., a permanent bow of about 3 to 10 mm) at the center of the carrier. It is contemplated that a different number, size, or arrangement of the solar cell substrate or the carrier are possible upon the need of processing schemes.

In operation, one or more carriers loaded with a plurality of solar cell substrates move through a lock valve chamber (not shown) into the input region 202 via a transport system or an automation device (not shown). The automation device generally contains a plurality of rollers or any other similar mechanism such as a conveyor belt for linearly transporting the carrier through individual chambers or processing regions. In one embodiment, the input region 202 contains an entry chamber, a buffer chamber, and a transfer chamber for pre-treating the solar cell substrates. In one example, the entry chamber may function as a load lock chamber. Typically, after pumping down the entry chamber, the carrier is conveyed to the buffer chamber where the substrates may be pre-heated to temperatures of about 300° C. The carrier then is conveyed through the transfer chamber to an evaporation region 204. In the evaporation region 204, a conducting layer 114 such as aluminum is evaporated upwardly, from the bottom of the carrier, to a backside of the solar cell substrate 110. It is contemplated that a different process may be used to form the conducting layer 114 in this stage, such as a physical vapor deposition process or other similar deposition processes.

After deposition of the conducting layer 114 on the back surface of the solar cell substrate, the carrier is conveyed to a laser firing region 206 to create contact points on the solar cell substrates. In one embodiment, a laser is used in the laser firing region to heat the aluminum locally to drive it through the insulating backside dielectric layer 111. In one example, the heated aluminum can be alloyed or diffused several microns deep (e.g., about 15 μm) into a silicon containing solar cell substrate, creating localized Al/Si alloy backside contact points, as regions 125 shown in FIG. 1*d*. In one embodiment, the laser may be a Nd:YAG laser, Nd:YVO$_4$, or any other suitable laser performed in a manner as described previously in the section entitled "Laser Removal Methods." In one example, the laser may be a Nd:YAG laser emitting at 532 nm or 1064 nm. During the process, the laser is directed to a side of the solar cell substrates, single pulse per contact, to create a plurality of contact points on the solar cell substrates. In one example, a single solar cell substrate having a surface area about 180 mm×180 mm may contain up to 25,000 laser fired contact points, each with a pitch about 1 mm and a diameter of about 85 μm. It is believed that laser fired contacts offer a stable and excellent performance since the energy density, pulse duration, or landing position and depth of the laser beam etc. can be precisely adjusted and controlled in light of the material properties of the substrate or processing regimes.

Subsequently, in one embodiment, the carrier is conveyed to the sputtering region 208 where a capping layer (e.g., NiV) or a conductive front or back contact structure (e.g., Ag) of the solar cell may be formed using a PVD process or conventional processes. After deposition, the carrier is conveyed into the output region 210 through a transfer chamber, a buffer chamber, and to an exit chamber to unload the solar cell substrates from the carrier. The carrier then is returned to the input region for loading new incoming solar cell substrates. Various processing region that may be performed in this processing system 200 are not shown. For example, in one embodiment a gas separation step may be provided immediately before and/or after the laser firing region 206 to isolate laser firing chamber from deposition chambers. In another embodiment, an annealing region may also be provided following the sputtering region 208 for thermal treatment of the solar cell substrates.

It should be noted that the processing regions shown here are only intended to illustrate some of the various aspects of the invention and are not intended to be limiting as described.

In one embodiment, for example, after depositing the dielectric layer 111 on the back surface 120 of the substrate 110 (as shown in FIG. 1*e*), the carrier may be conveyed to a laser firing region 206 where a laser is used to remove portions of the dielectric layer 111 to form one or more exposed regions 126, as shown in FIG. 1*f*. Following the removal of portions of the dielectric layer 111, the carrier is conveyed to the evaporation region 204, where a conducting layer 114 is deposited over the back surface 120 of the substrate 110 (as shown in FIG. 1*g*), by, for example, a PVD process (sputter-deposition, evaporation, etc.). In another embodiment, an annealing region may also be provided following the evaporation region 204 for thermal treatment of the solar cell substrates. Therefore, a similar structure to the device as shown in FIG. 1*d* is formed, which has an electrical connection formed between the substrate surface 110A and the conducting layer 114 through the exposed regions 126.

In operation, a system controller 201 may be adapted to facilitate the control and automation of the overall system 200 and may include a central processing unit (CPU) (not shown), memory (not shown), and support circuits (or I/O) (not shown). The CPU may be one of any form of computer processors that are used in industrial settings for controlling various chamber processes and hardware (e.g., automation device, optical inspection assemblies, motors, laser module hardware, or processing gas delivery etc.) and monitor the system and chamber processes (e.g., substrate position, process time, or detector signal etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like. A program (or computer instructions) readable by the system controller 201 determines which tasks are performable on a substrate. Preferably, the program is software readable by the system controller 201, which includes code to generate and store at least substrate positional information, the sequence of movement of the various controlled components, substrate optical inspection system information, laser module parameters, and any combination thereof.

Figure 2:
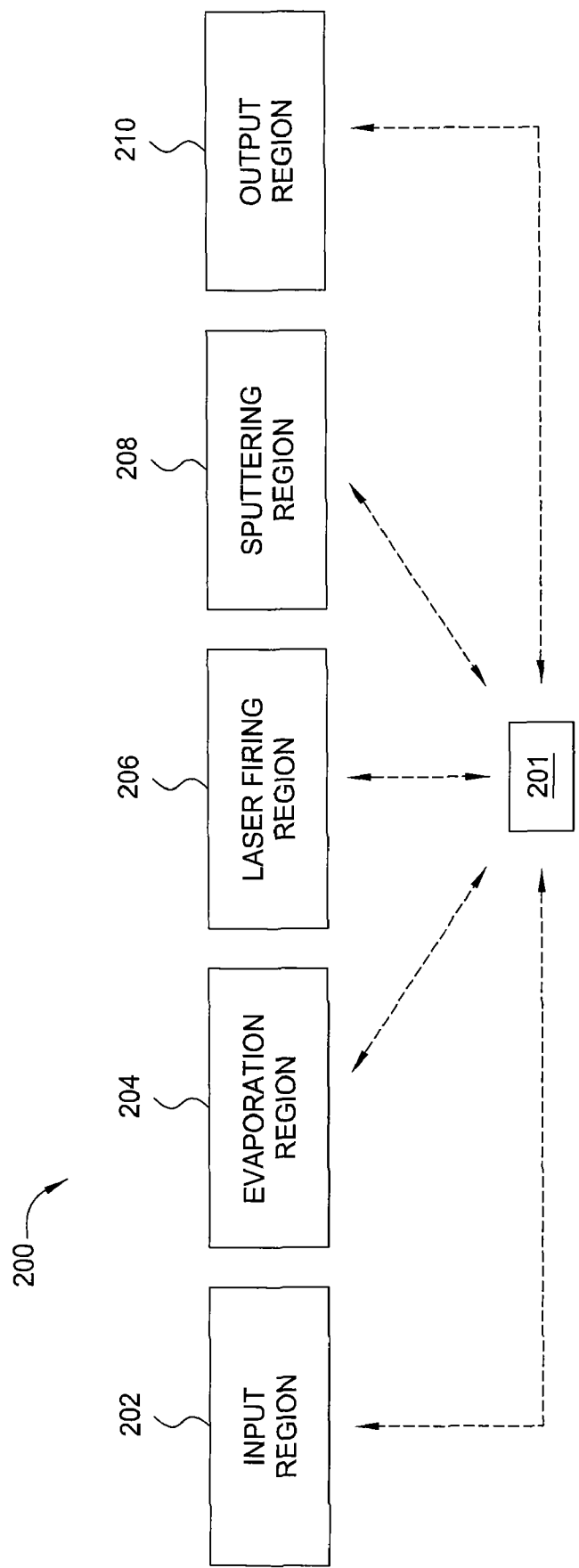
FIG. 2 illustrates a simplified diagram of an example processing system for practicing the present invention.
Figure 3:
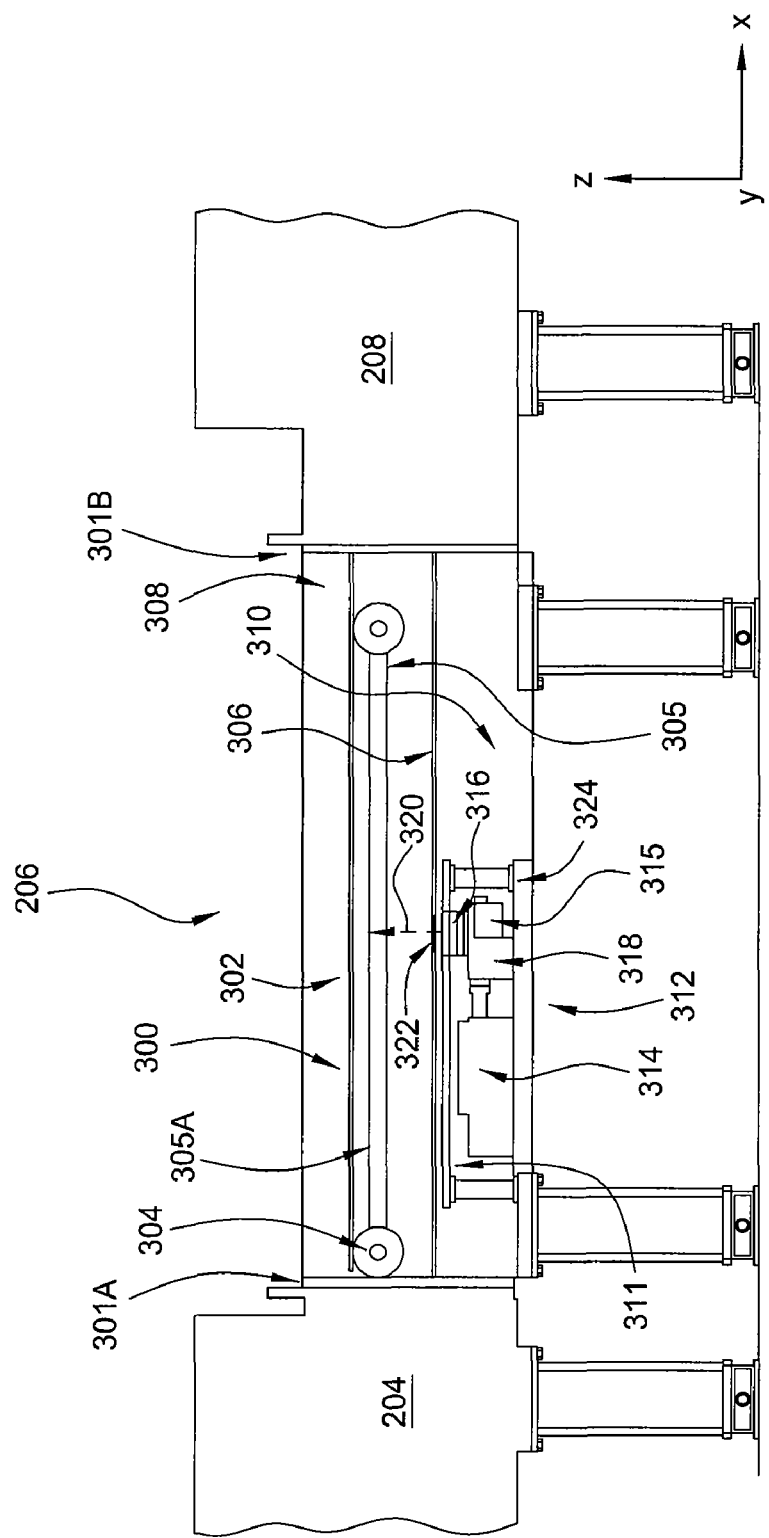
FIG. 3 illustrates a cross-sectional view of one embodiment of the laser firing region as shown in FIG. 2.

FIG. 3 illustrates a cross-sectional view of one embodiment of the laser firing region 206 as shown in FIG. 2. In one embodiment, the laser firing region 206 generally contains a laser firing chamber 300 that is provided between the evaporation region 204 and the sputtering region 208. In one embodiment, the evaporation region 204, the laser firing region 206, and the sputtering region 208 are in fluid communication with one another and share a common environment that is generally maintained at a vacuum condition. In one embodiment, the carrier 302, in which a plurality of solar cell substrates are placed, can be conveyed from the evaporation region 204 through the laser firing region 206 to the sputtering region 208 without exposure to outside conditions or contaminates. In one configuration, the carrier 302 is conveyed in a longitudinal (X) direction of the laser firing chamber from an input 301A to an output 301B of the laser firing chamber 300 via a transport module 305. In one embodiment, the transport module 305 is a hollow rectangular frame body having a plurality of rollers 304 disposed thereon for linearly transporting the carrier 302. The rollers 304 may be rotatably disposed within one or more circular-cut (parabolic in cross-section) notches (not shown) formed in a top surface of opposing sides of the frame body of the transport module 305. In one embodiment, the rollers 304 are magnetically disposed within the circular or parabolic notch so that they can be easily removed or replaced. It is contemplated that the transport module 305 may use different approaches for linear transportation of the carrier 302. For example, the carrier 302 may be conveyed through a conveyor belt or similar mechanism for linear transportation.

The components of the chamber assembly and parts of the frame body may contain materials such as stainless steel, aluminum, nickel-plated aluminum, nickel, alloys thereof, or other suitable materials. In one embodiment, the frame body may be independently fabricated, machined, forged, or otherwise made from a metal, such as aluminum, an aluminum alloy, steel, stainless steel, alloys thereof, or combinations thereof.

Although not shown here, the evaporation region 204 may contain one or more processing chambers that are arranged in an in-line or linear configuration. The processing chamber may be an evaporation chamber, a molecular beam epitaxy chamber, a PECVD chamber, a CVD chamber, or a PVD chamber. In one aspect, two PVD chambers are installed in a linear configuration within the evaporation region 204. When a conducting layer having two layers is desired, such an arrangement would enable the conducting layer to be formed by first depositing, for example, an aluminum layer by a PVD process in the first PVD chamber, and then depositing, for example, a nickel vanadium (NiV) capping layer by another PVD process in the second PVD chamber. Similarly, the sputtering region 208 may contain one or more processing chambers that are arranged in an in-line or linear configuration. The processing chamber may be a PVD chamber, depending on the processing regimes. Although the laser firing region 206 is illustrated to be arranged between the evaporation region 204 and the sputtering region 208, it is contemplated that a different processing sequence is possible. For example, in one embodiment the laser firing region may be arranged following the sputtering region such that the carrier sequentially travels through the evaporation region, the sputtering region, and then the laser firing region. In another embodiment where two PVD chambers are used in the evaporation region. In this case, the laser firing region may be arranged between that two PVD chambers so that the carrier sequentially travels through the first PVD chamber, the laser firing region, the second PVD chamber.

As shown in FIG. 3, the laser firing chamber 300 is divided into an upper region 308 and a lower region 310 by a sealing plate 306. The sealing plate 306 is provided such that the upper region 308 of the laser firing chamber 300 is in a vacuum environment. In one aspect, the sealing plate 306 is disposed such that the plurality of solar cell substrates placed in the carrier 302 is in a vacuum condition. Generally, the vacuum environment is maintained when the carrier 302 moves between the evaporation region 204 and the sputtering region 208 during the laser firing process. When the carrier 302 exits the laser firing chamber 300, the carrier 302 can be in either a vacuum or atmospheric environment. The sealing plate 306 also prevents any residues or particles from falling on the lens assembly of the laser module 312. In one embodiment where one or more openings 322 are provided in the sealing plate 306, a replaceable shield assembly (not shown) may be disposed between the carrier 302 and the sealing plate 306 to prevent particles that may occur during the laser firing process from directly falling on the lens assembly of the laser module 312, thereby reducing the cleaning time that would otherwise required when the shield assembly is not used.

In one embodiment, the laser module 312 is disposed under the carrier 302. In one example, the distance between the rear surface of the carrier 302 and the top surface of the laser scanning head 316 is about 300 mm. The laser module 312 generally contains a laser beam source or laser head 314, an optical assembly 318, and a laser beam scanner 315. The number of the laser beam source, the optical assembly, or the laser beam scanner varies upon budgetary considerations for the laser head (will be discussed later). The laser beam source or laser head 314 is provided to generate a laser beam. The laser beam emanated from the laser beam source travels to the optical assembly 318 where the laser beam is directed to one or more laser beam scanners 315. In one embodiment, the laser beam scanner 315 is a galvanometer type scanner. In one aspect, the focal length of the objective lens of the laser scanner is typically chosen to be 254 mm resulting in a working area of $180 \times 180$ mm$^2$ and a high depth of focus being tolerant to uneven the substrate surfaces. It is contemplated that the focal length of the objective lens of the laser scanner may be varied in order to obtain a different working area. For example, the focal length of the objective lens of the laser scanner may be 300 mm to obtain a working area of $156 \times 156$ mm$^2$. As will be discussed below, laser processing of the entire rear surface of a $156 \times 156$ mm$^2$ can be performed in just a few seconds by using the laser scanner.

In one embodiment, the laser beam scanner 315 is disposed beneath the carrier 302 and designed to direct the laser beam upwardly to the back surface of the solar cell substrates placed in the carrier 302. In one aspect, the laser beam scanner 315 is provided with one or more upward-looking laser scanning heads 316 such that the emanated laser beam 320 travels up through one or more openings 322 to the backside of the carrier 302. As the carrier 302 is designed to support the plurality of solar cell substrates without obstructing the rear surface of the solar cell substrates, the upward laser beam 320 will be able to deliver energy to portions of one or more materials from the backside of the solar cell substrates in a desired pattern. Although not shown here, it is contemplated that the laser module 312 may be located above the carrier 302 and configured to deliver the beam of energy to the top side of the solar cell substrates traveling thereunder. In such an embodiment, when the rear side of the solar cell substrates needs a laser firing process, a substrate flipper (not shown) may be used to flip or rotate the solar cell substrates 180 degree so that the other side (i.e., the rear side) of the solar cell substrates can be processed by the downward laser beam.

As shown in FIG. 3, the laser module 312 is configured to direct the upward laser beam 320 through one or more openings 322 to the rear side of the solar cell substrates placed in the carrier 302. In one aspect, the openings 322 may form through the sealing plate 306. In one aspect, each opening 322 has a transparent window disposed therein. The opening 322 or window is generally sized and arranged so as to prevent particles that may occur during laser firing process of solar cell substrates from falling on the lens of the laser scanning head 316. In one embodiment, the transparent window portion may be disposed between the carrier and the laser module. The number and the arrangement of the opening 322 depends on the number and arrangement of the laser scanning head 316 adapted in the laser firing chamber 300, which will be discussed in detail below.

Figure 3A:
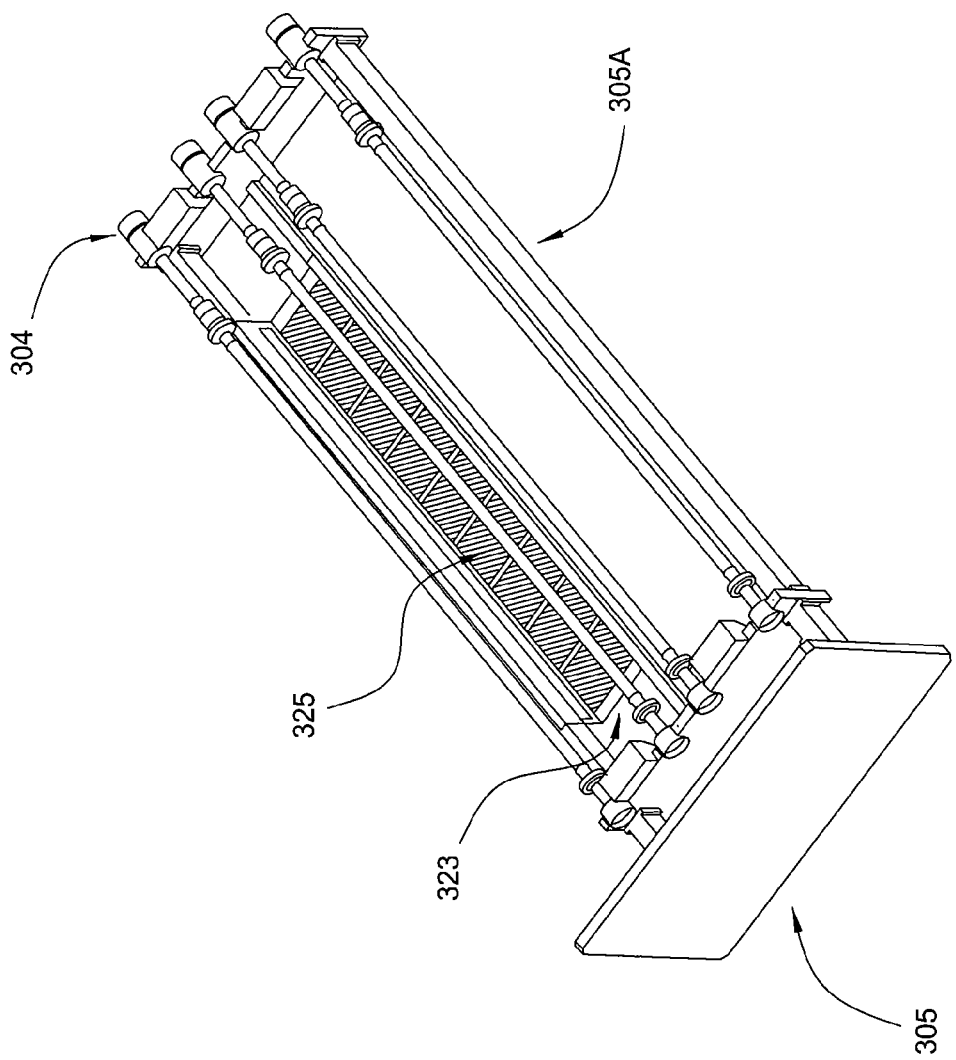
FIG. 3a illustrates a prospective view of one embodiment of a window assembly disposed on a hollow frame body of a transport module according to one embodiment of the present invention.

In addition to arranging the transparent window in the openings 322, a window assembly may be further provided to enhance the cleanliness or protection of the laser scanning heads 316. In one aspect as shown in FIG. 3a, the window assembly 323 is disposed on the hollow frame body 305A of the transport module 305 and having a transparent window portion 325 spanned across the opposing sides of the hollow frame body 305A. In such a case, the window assembly 323 may be U-shaped in cross-section and rested or hanged on the hollow frame body 305A of the transport module 305 in a manner such that the transparent window portion 325 is below and not interfering with the roller 304 disposed on the frame body 305A of the transport module 305. In one aspect, the window assembly 323 is removably disposed on the frame body 305A of the transport module 305 in a manner such that it can be easily accessed to clean or replaced when it reaches the cleanliness threshold. Alternatively, the window assembly 323 may be disposed in a place between the carrier 302 and the laser scanning head 316 other than in the sealing plate 306. In either case, the window assembly 323 or the transparent window portion 325 should be shaped and sized to substantially cover an outputting region of the laser beam. In one aspect, the window assembly 323 or the transparent window portion 325 generally has a surface area that is sufficiently large to encompass one or more laser scanning heads 316, thereby preventing particles that may occur during the laser firing process of solar cell substrates from falling on the lens of the laser scanning head 316.

Referring back to FIG. 3, in one embodiment, the laser module 312 having an upward-looking laser scanning head 316 is mounted directly to a bottom plate 324 of the laser firing chamber 300 as shown in FIG. 3. In another embodiment, the laser module 312 having an upward-looking laser scanning head 316 may be indirectly mounted to the bottom plate 324 of the laser firing chamber 300 through a base plate (not shown). In such an embodiment, the base plate is located immediately above the bottom plate 324 and secured to the bottom plate 324 by screws or any similar manners. In one aspect, the base plate having the laser module 312 mounted thereon moves within the lower region 310 of the laser firing chamber 300 in either a transverse (Y) direction or a longitudinal (X) direction. In such a case, the base plate may be configured to slide within the lower region 310 of the laser firing chamber 300 through one or more linear rails (not shown) attached to the bottom plate 324 of the laser firing chamber 300 or a similar mechanism such as an X-Y stage. In one aspect, the X-Y stage is configured to move the base plate along with the laser module 312 relative to the carrier 302 using an actuator.

In one embodiment, the laser module 312 may be mounted to the bottom plate 324 of the laser firing chamber while having the upward-looking laser scanning head 316 formed through and disposed flush with an upper surface of an upper supporting plate 311. The upper supporting plate 311 is generally located below the sealing plate 306 and opposite to the front side of the bottom 324 of the laser firing chamber 300. In one another embodiment, the laser module 312 may be upside down and mounted to the upper supporting plate 311, instead of directly or indirectly mounted to the bottom plate 324 of the laser firing chamber 300. In such an embodiment, the upward-looking laser scanning head 316 of the laser module 312 (e.g., the lens portion) is formed through and disposed flush with the upper surface of the upper supporting plate 311 so that it is still facing the backside of the carrier 302 and able to provide an upward laser beam 320 for processing the backside of the solar cell substrates. Alternatively, the upward-looking laser scanning head 316 may be configured to extend beyond the edge of the upper supporting plate 311, instead of having the lens portion formed through the upper supporting plate 311.

In the embodiment where the laser module 312 is mounted to the upper supporting plate 311, the upper supporting plate 311 may be configured to slide over the rear side of the sealing plate 306, i.e., within the lower region 310 of the laser firing chamber in a transverse (Y) direction as shown. In such an embodiment, the upper supporting plate 311 slides through one or more linear rails or similar mechanism that is attached to the backside of the sealing plate 306. In one aspect, an X-Y stage is used to move the upper supporting plate 311 along with the laser module 312 relative to the sealing plate 306 or the carrier 302 through an actuator (not shown). It is contemplated that the laser module 312 mounted on the upper supporting plate 311 may also slide over the rear side of the sealing plate 306, i.e., within the lower region 310 of the laser firing chamber in a longitudinal (X) direction, depending upon the need for different processing schemes.

The laser module 312 can be in a vacuum or atmospheric environment when moving within the laser firing chamber 300. As described above, the laser module 312 can be pulled out or removed from the laser firing chamber 300 in a transverse (Y) direction of the laser firing chamber, without breaking a vacuum condition of the upper region 308 where the carrier 302 is located. By doing so, the possibility of contaminating the solar cell substrates is minimized. Similarly, the transport module 305 can be pulled out or removed from the laser firing chamber 300 in a transverse (Y) direction of the laser firing chamber for maintenance.

FIG. 4 illustrates a schematic diagram of a laser module 402 that uses a beam splitting method according to one embodiment of the present invention. For clarity, the transport module, the rollers, and the chamber wall are not shown. As shown in FIG. 4, a rectangular array of the plurality of the solar cell substrates 406 are placed in the carrier 302, which is being conveyed above the laser module 402 in a longitudinal (X) direction of the laser firing chamber. In this embodiment, the laser module 402 is mounted to the bottom plate 324 of the laser firing chamber 300 (FIG. 3) on which three or more poles 410, for example, six poles 410 are equally located along each side for the support of the chamber wall or sealing plate 306. Although not shown in the figure, the bottom plate 324 may be secured to the bottom of the laser firing chamber 300 by screws or any other suitable manners. In one embodiment, the laser module 402 generally contains multiple laser beam sources 414, optical assemblies 416, and laser scanners or laser scanning heads 418. Each laser beam source 414 provides a laser beam to the optical assembly 416 where the incident laser beam is directed to multiple upward-looking laser beam scanners 418, thereby emitting multiple upward laser beams 320, through a sealing plate 313, onto the backside of the solar cell substrates 406. In one embodiment, each of three laser scanning heads 418 fires a laser beam through windows (not shown) formed in the sealing plate 306 to process a group of three solar cell substrates 406 across the transverse (Y) direction while the solar cell substrates are moving through the laser firing chamber, allowing each solar cell substrate 406 to receive a full power of the laser beam.

Figure 5:
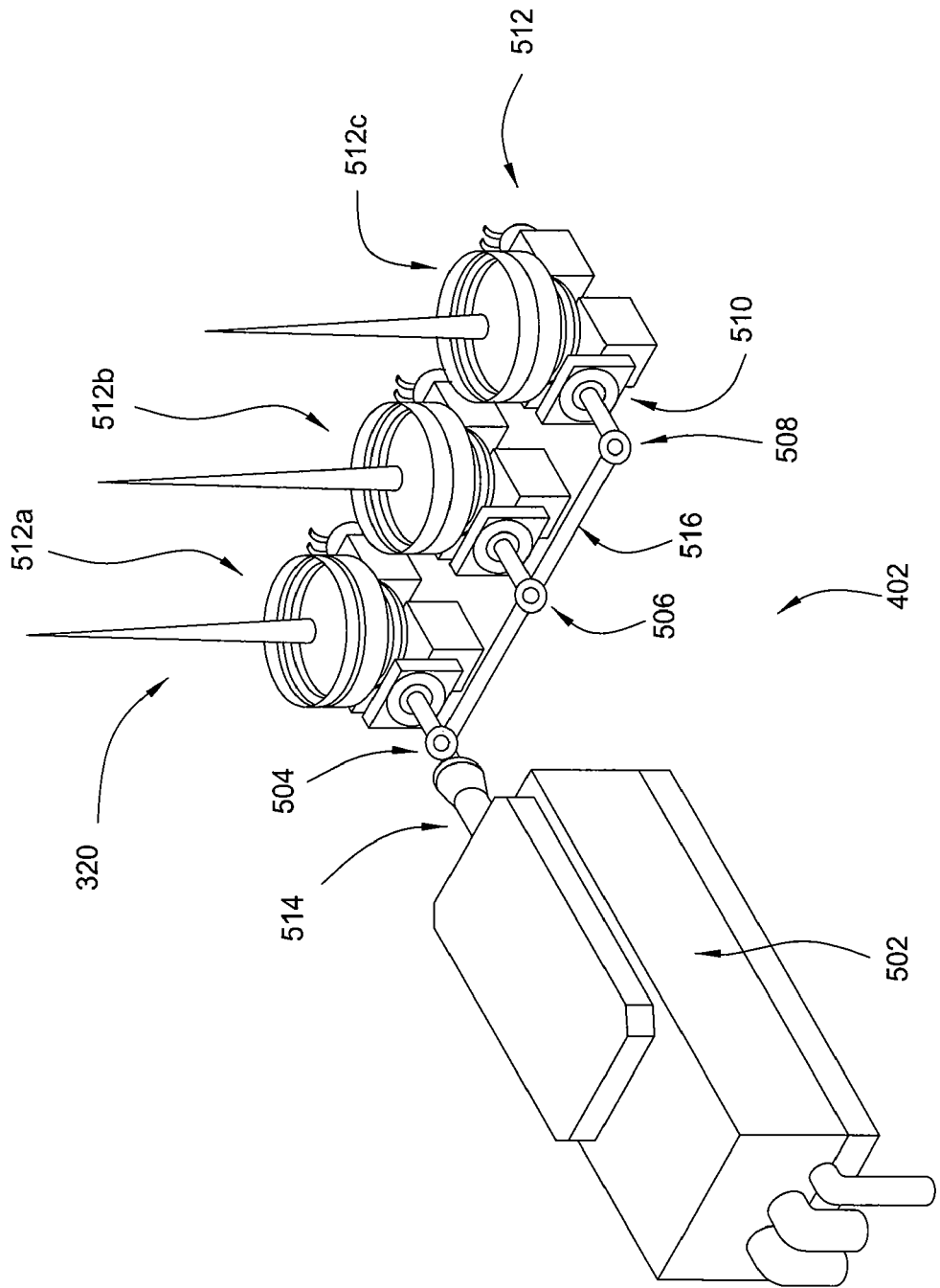
FIG. 5 illustrates a schematic diagram of a set of the laser module adapting a concept of beam switching method according to one embodiment of the present invention.

FIG. 5 illustrates a detailed view of a laser module 402 that uses a beam splitting method, which is illustrated in FIG. 4. It should be noted that although only one laser module 402 is shown for illustration purpose, the number of the laser module 402 in the laser firing chamber 300 may vary upon the specification of the laser firing chamber 300 and the number of the solar cell substrates to be processed. In one aspect, the laser module 402 generally contains a laser beam sources 502, a first beam splitter 504 and a second beam splitter 506, a mirror 508, a beam-splitting polarizer 510, and three upward-looking laser scanning heads 512. A beam expander 514 may be optionally included to increase a diameter of the laser beam. In operation, the laser beam 516 generated from each of the laser beam sources 502 travels through the beam expander 514 toward the first beam splitter 504, which is designed to split the incident laser beam such that one half of the beam 516 is reflected to one of the laser scanning heads (i.e., the laser scanning head 512a) and one half is transmitted through along a desired path toward the second beam splitter 506. A certain percentage of beam reflection (e.g., about 67% reflection) from the first beam splitter 504 then travels to the second beam splitter 506 where one half of the beam 516 is again reflected to the second one of the laser scanning heads (i.e., the laser scanning head 512b) and one half is transmitted through along the designed path toward the mirror 508. A certain percentage of beam reflection (e.g., about 50% reflection) from the second beam splitter 506 then travels to the mirror 508 that is arranged at an angle to direct the laser beam 516 to the third one of the laser scanning heads (i.e., the laser scanning head 512c).

In one embodiment, the beam-splitting polarizer 510 is disposed between the beam splitter or the mirror and the laser scanning head to equalize the beam power of the laser beam. In such a manner, each row of the solar cell substrates will be simultaneously processed by an equal amount of laser beam power. It is contemplated that a different number or arrangement of the polarizer, beam splitters or mirrors is possible based on the processing needs of the system. By using the beam splitting concept shown in FIG. 5, a single laser beam source 502 can be split in three ways to laser scanning heads 512 for processing three solar cell substrates per row, without the need of using a dedicated laser beam source for each laser scanning head. When three laser beam sources are used, for example, a back surface of nine solar cell substrates can be processed simultaneously. Therefore, a fast system throughput comparable to dedicated laser concept is obtained.

It is contemplated that a beam splitting method using three laser beam sources 414 as shown in FIG. 4 is merely one of the alternative embodiments to practice the present invention. The laser beam source described herein may be configured in any number or any desired arrangement, as required to match the arrangement of the solar cell substrates being placed in the carrier. When a dedicated beam source concept is adapted, a dedicated laser beam source is designated for each laser scanning head. For example, the laser module may adapt nine laser beam sources or laser heads that are dedicated to nine laser scanning head. A dedicated laser source is generally desirable for a best laser pattern quality, which is, however, quite expensive. In order to reduce the cost of ownership, the inventors have further developed various approaches to yield a similar performance with a minimum number of the laser beam sources, as will be discussed below.

Figure 6:
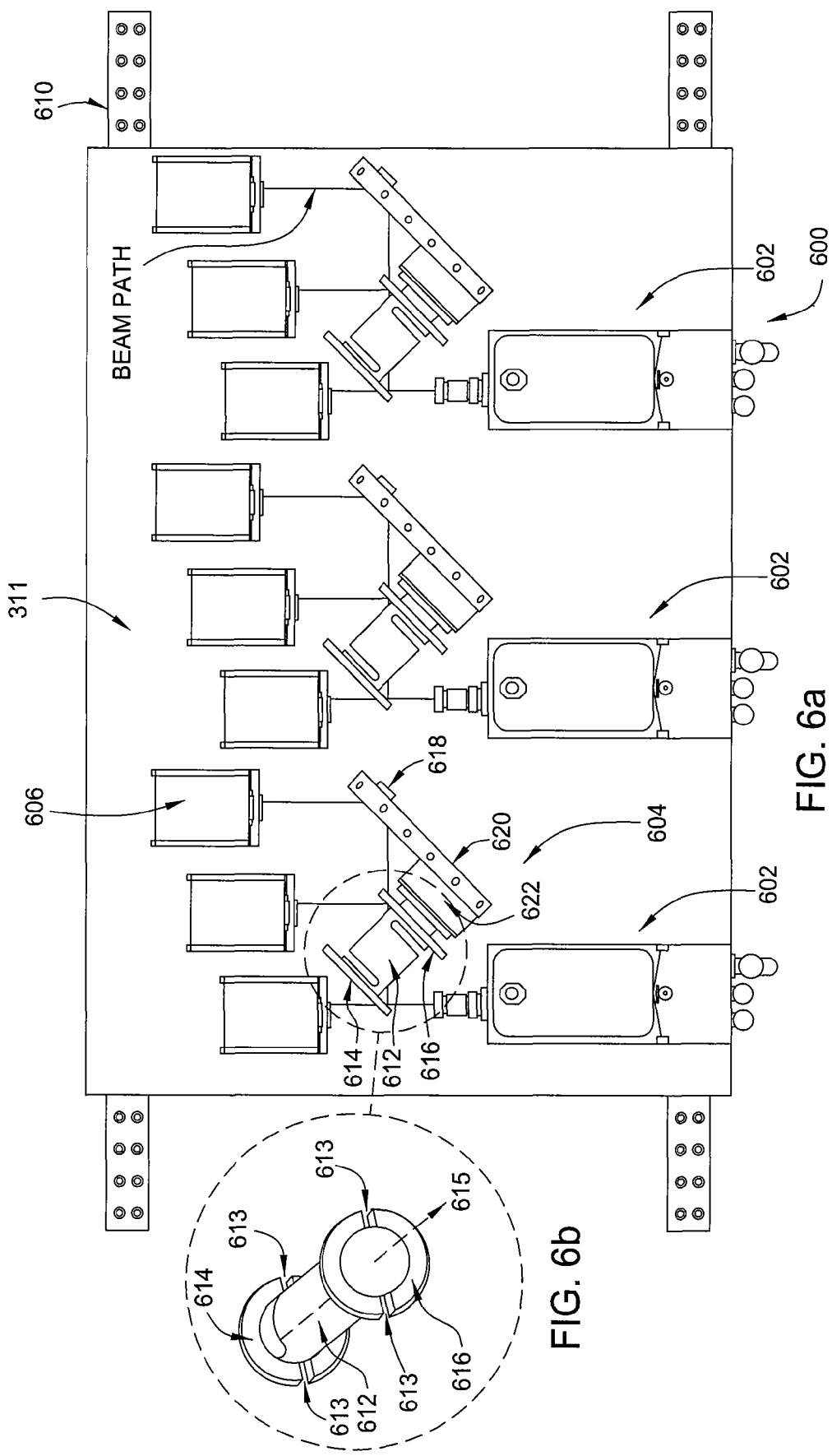

FIG. 6a illustrates a top view of a laser module 600 that uses a beam switching method according to another embodiment of the present invention, which rotates a mirror/window assembly to direct the laser beam to one or more laser scanning heads. In this embodiment, the laser module 402 generally contains three laser beam sources 602, an annular mirror/window assembly 604, and nine laser scanning heads 606, all mounted to a supporting plate 311 that slides along a pair of linear rails 610 over the backside of a sealing plate (not shown). Although not shown in the figure, it is contemplated that lens assembly of the laser scanning head 606 is formed through and disposed flush with an upper surface of the supporting plate 311 such that the laser scanning head 606 faces the backside of the carrier on the other side of the supporting plate 311, as discussed above. It is also contemplated that each of the laser scanning head 606 may correspond to an opening or a transparent window (not shown) formed in the sealing plate.

As shown in FIG. 6a, the annular mirror/window assembly 604 generally contains a mounting plate 620 coupled to a shaft 612 via an actuator 622. In one aspect, the shaft 612 is rotatably coupled to an actuator 622 and has a first annular mirror 614 and a second annular mirror 616 coupled at each end of the shaft 612. In one embodiment, the first annular mirror 614, the second annular mirror 616, and the mounting plate 620 are parallel to one another and perpendicular to the supporting plate 311. The mounting plate 620 is mounted to the supporting plate 311 and being arranged at an angle with respect to a laser beam path toward the laser scanning head 606. In one aspect, the actuator 622 is configured to independently rotate the first and the second annular mirror 614, 616 through the shaft 612. In one aspect, the diameter of the first annular mirror 614 and the second annular mirror 616 is relatively larger than that of the shaft 612 in order to reflect the incident laser beam.

FIG. 6b illustrates a prospective and enlarged view of an annular mirror/window assembly shown in FIG. 6a, where each of the first and the second annular mirror 614, 616 has a slit window 613 that is designed to selectively reflect or block, when rotating the first and the second annular mirror 614, 616, a laser beam traveling to the laser scanning head 606. The slit window 613 in each of the first and the second annular mirror 614, 616 extends from one end of the annular mirror through a central axis 615 of the first and the second annular mirror to the other end, thereby forming two opposite slit windows 613 (since the center portion of the first and the second annular mirror coupled to the shaft 612) in each of the first and the second annular mirror 614, 616. Referring back to FIG. 6a, in one aspect, the first annular mirror 614, the second annular mirror 616, and the mounting plate 620 are arranged at an oblique angle with respect to a central line of the laser scanning head 606. In one aspect, a stationary window 618 is provided on one end of the mounting plate 620 at a level to which the reflected laser beam traveling through the slit window 613 of the second annular mirror 616 is reached. As the rotation of the first and the second annular mirror 614, 616 can be independently controlled through the actuator 622, it is able to direct the incident laser beam from one single laser beam source 602 to three laser scanning heads 606 by selectively permitting or blocking the incident laser beam from passing through the slit windows 613. For example, the laser beam from the laser beam source can travel through the slit window 613 of the first annular mirror 614 to the first laser scanning head. The first annular mirror 614 then is rotated by 90 degree to turn a non-slit portion to the incident laser beam, thereby reflecting the incident laser beam to the second annular mirror 616. Similarly, the second annular mirror 616 may be rotated to block and reflect the incident laser beam to the second laser scanning head, or permit the incident laser beam traveling directly through the slit window 613 of the second annular mirror 616 to the stationary mirror 618 of the mounting plate 620, from which the laser beam is directed to the third laser scanning head. In this way, a single laser beam from one laser beam source can be switched to three different laser scanning heads to process a group of three solar cell substrates (not shown) across the transverse (Y) direction, allowing each of the solar cell substrates in that group to receive a full power of the laser beam. When numerous laser beam sources, for example, three laser beam sources, are used, a back surface of nine solar cell substrates can be processed simultaneously. Therefore, a fast system throughput comparable to dedicated laser concept is obtained.

Figure 7:
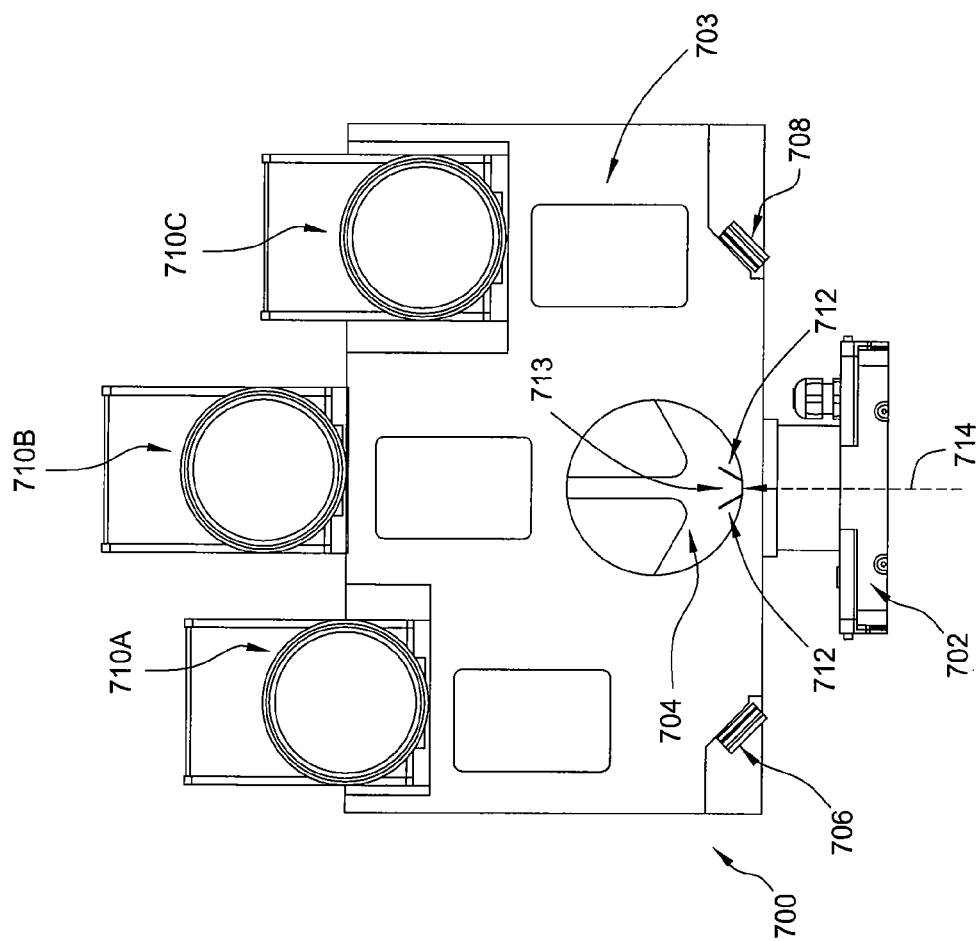
FIG. 7 illustrates a top view of a laser module adapting another beam switching concept according to one embodiment of the present invention.

FIG. 7 illustrates a top view of a laser module 700 adapting another beam switching concept according to one embodiment of the present invention, which switches a mirror assembly 704 and one or more adjustable mirror 706, 708 to selectively direct a laser beam to one of the laser scanning heads. In one embodiment shown in FIG. 7, the laser module 700 generally contains a laser beam source 702, an optical assembly 703 having a switching mirror assembly 704, a first and a second adjustable mirrors 706, 708, and three laser scanning heads 710 (e.g., reference numerals 710A-710C in FIG. 7). In one aspect, the switching mirror assembly 704 in the optical assembly 703 generally contains a pair of switching mirrors 712 symmetrically spaced-apart from one another at an oblique angle relative to a central line of the incident laser beam 714. In one aspect, the first adjustable mirror 706 is disposed on the left side of the pair of switching mirrors 712 while the second adjustable mirror 708 is disposed on the right side of the pair of switching mirrors 712. In one embodiment, the first adjustable mirror 706, the second adjustable mirror 708, and the pair of switching mirrors 712 may be aligned with one another along a beam path in a given coordinate axis. Alternatively, the first adjustable mirror 706, the second adjustable mirror 708, and the pair of switching mirrors 712 may not need to be aligned with each other, as long as they are arranged in a relationship to direct the laser beam to a respective laser scanning heads 710A-710C. In one embodiment, the laser scanning heads 710A-710C is in a staggered configuration (i.e., staggered relative to each other) as one example shown in FIG. 7. In operation, the switching mirror assembly 704 is configured to rotate back and forth in order to direct the incident laser beam 714 to one of the laser scanning heads 710A-710C.

FIGS. 7a, 7b, and 7c depict enlarged views of the switching mirror assembly 704 and the first and the second adjustable mirrors 706, 708 of FIG. 7, showing a simplified switching mirror assembly 704 in a different position. In FIG. 7a, the switching mirror assembly 704 may be controlled to be held at 0 degree such that the incident laser beam 714 is traveling directly through a gap 713 between the pair of switching mirrors 712 to the first laser scanning head 710B. In FIG. 7b, the switching mirror assembly 704 is rotated a desired angle, for example, in about 15 degree counterclockwise, so that the incident laser beam strikes one of the pair of switching mirrors 712. As the pair of switching mirrors 712 is arranged at an oblique angle, the incident laser beam will be reflected from one of the pair of switching mirrors 712 to the first adjustable mirror 706 when the switching mirror assembly 704 is rotated. The first adjustable mirror 706 then is controlled to reflect the incident laser beam at a pre-determined angle to one of the laser scanning heads 710A. Similarly, in FIG. 7c, the switching mirror assembly 704 may be rotated a desired angle, for example, in about 15 degree clockwise, so that the incident laser beam strikes one of the pair of switching mirrors 712. As the pair of switching mirror 712 is arranged at an oblique angle, the incident laser beam will be reflected from one of the pair of switching mirrors 712 to the second adjustable mirror 708. The second adjustable mirror 708 then is controlled to reflect the laser beam at a pre-determined angle to one of the laser scanning heads 710C. Since the switching mirror assembly 704 and the adjustable mirror 706, 708 can be independently and continuously rotated to a desired angle during processing, it becomes possible to enable different landing positions of the laser beam on the rear surface of the target substrates. Upon rotation of the switching mirror assembly 704, a single laser beam can be switched to three different laser scanning heads 710 to process a group of three solar cell substrates across the transverse (Y) direction, allowing each of the solar cell substrates in that group to receive a full power of the laser beam. When numerous laser beam sources, for example, three laser beam sources, are used, a back surface of nine solar cell substrates can be processed simultaneously. Therefore, a fast system throughput comparable to dedicated laser concept is obtained. Although not specifically discussed here, it is contemplated that the mirrors can be in any shape with various diameters to enable a maximum scanning angle. In addition, a different number, angle, or arrangement of the mirror assembly is possible in view of the target substrates to be processed.

In one another embodiment, the laser module may generally contain an x-y mirror pair mounted on rotary motors (not shown). In one aspect, an X-axis mirror is rotatably coupled to an X-axis motor, and a Y-axis mirror is rotatably coupled to a Y-axis motor. In one aspect, the X-axis mirror and the Y-axis mirror are arranged in a relationship such that the X-axis mirror reflects an incident laser beam to the Y-axis mirror from which the laser beam is directed to travel through objective lens of the laser beam scanner to one or more solar cell substrates. The rotation of the X-axis mirror and Y-axis mirror is continuously and independently controlled to enable various landing positions of the laser beam over the entire rear surface of the target substrates. In one aspect, the X-axis mirror and the Y-axis mirror are rotate at the same speed. In another aspect, the Y-axis mirror may not required to rotate at the same speed as the X-axis mirror. In one another aspect, the X-axis mirror is stationary while rotating the Y-axis mirror a desired angle. Alternatively, the X-axis mirror may not rotate until the rotating Y-axis mirror finish scanning across a single line of the substrate. In such an aspect, the laser processing may repeat until the entire surface of one or more solar cell substrates is scanned.

Figure 8A:
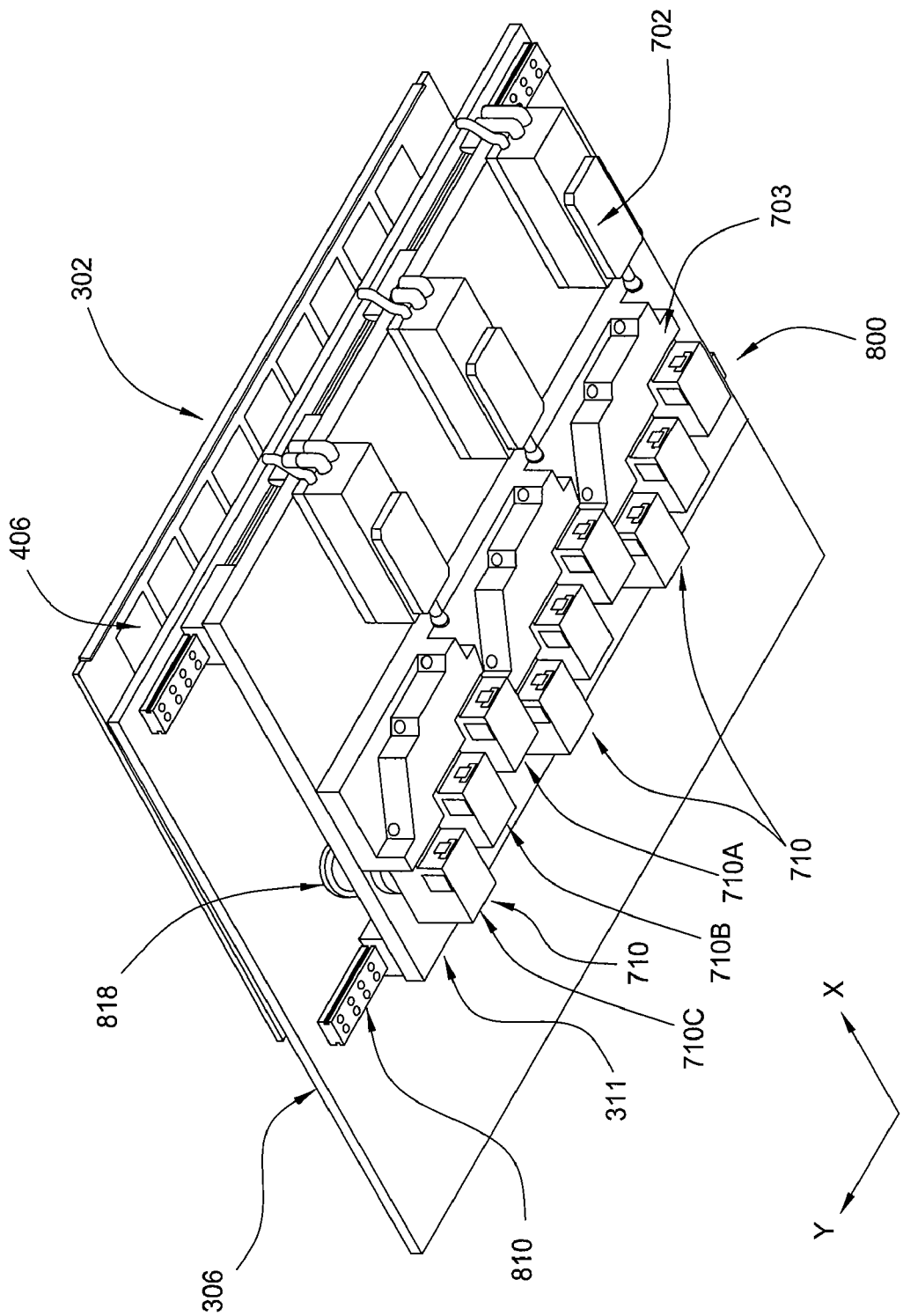
FIG. 8a is a schematic view of a laser module adapting a beam switching concept within the laser firing chamber according to one embodiment of the present invention.

FIG. 8a is a schematic view of a laser module 800 within the laser firing chamber 300, which adapts a beam switching concept according to one embodiment of the present invention. In one embodiment shown in FIG. 8a, the laser module 800 generally contains three laser beam sources 702, three optical assemblies 703, and nine laser scanning heads 710. In one aspect, the laser module 800 is mounted to an upper supporting plate 311 which slides through a pair of linear rails 810 from side to side across the backside of the sealing plate 306 while moving a carrier 302 that has numerous solar cell substrates 406 placed therein above the front side of the sealing plate 306. Although not shown in this figure, it is understood that the sealing plate 306 is generally disposed inside the laser firing chamber 300 and dividing the laser firing chamber 300 into an upper region 308 and a lower region 310, as discussed above with respect to FIG. 3. In one aspect, the upper region 308 and the lower region 310 may be in a vacuum or atmospheric condition. During processing, the carrier 302 conveys in a longitudinal (X) direction within the upper region 308 of the laser firing chamber 300, and the laser module 800 moves back and forth in a transverse (Y) direction within the lower region 310 of the laser firing chamber 300, as described previously.

As one embodiment shown in FIG. 8a, the laser module 800 scans the solar cell substrates 406 in the transverse (Y) direction of the laser firing chamber while moving the carrier 302 in the longitudinal (X) direction of the laser firing chamber. The laser beams are directed from the laser scanning head 710 to the back surface of the solar cell substrates 406 through windows 818 formed in the sealing plate 306. Since both the laser module 800 and the carrier 302 are moving simultaneously at a constant speed, when a dedicated beam source concept is not adopted, the laser scanning heads 710 may be arranged in banks in a staggered configuration so that the timing differences can be accounted for during processing. In one embodiment, the laser module 800 generally contains a plurality of sets of laser scanning heads 710 (e.g., reference numerals 710A-710C in FIG. 8*a*) in which each set of laser scanning heads is staggered relative to one another. The amount that the laser scanning heads are staggered relative to each other may gradually increase, remain constant or decrease across the length of the sealing plate 306. For example, in the embodiment of FIG. 8*a*, a horizontal level of each set of three laser scanning heads increases from the leftmost laser scanning head 710C to the rightmost laser scanning head 710A. In one aspect, each different set of three laser scanning heads is substantially at the same level with one another (i.e., along a given coordinate axis). During process, each of three laser scanning heads 710 fires a laser beam through windows 818 to process a group of three or more solar cell substrates 406 across the transverse (Y) direction, allowing each solar cell substrate 406 in that group to receive an equivalent amount of power in each of the laser beam pulses.

Figure 8B:
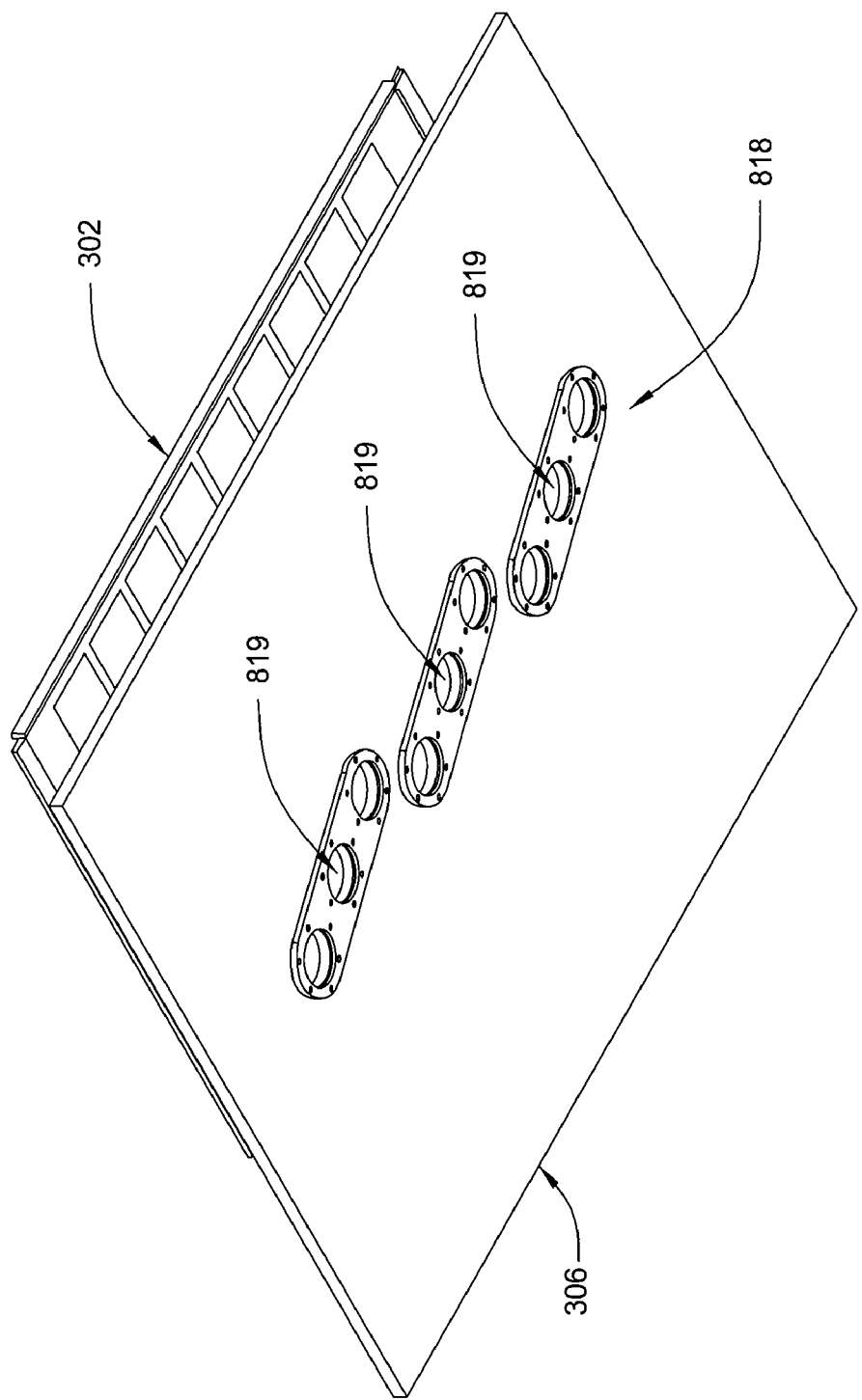
FIG. 8b illustrates a sealing plate having three sets of windows in a staggered arrangement in light of an arrangement of the laser scanning head.

FIG. 8*b* illustrates a sealing plate 306 having three sets of windows 818 in a staggered arrangement in light of an arrangement of the laser scanning head (not shown). As discussed previously, each opening or window 818 has a transparent window 819 disposed therein. It is contemplated that the staggered arrangement is merely one of the embodiments to practice the present invention. The laser scanning heads may be in any desired arrangement to take the time difference issue into consideration. It is also contemplated that the above hardware configurations and concepts is applicable to other processing applications, such as edge material removal or laser annealing process.

Figure 9A:
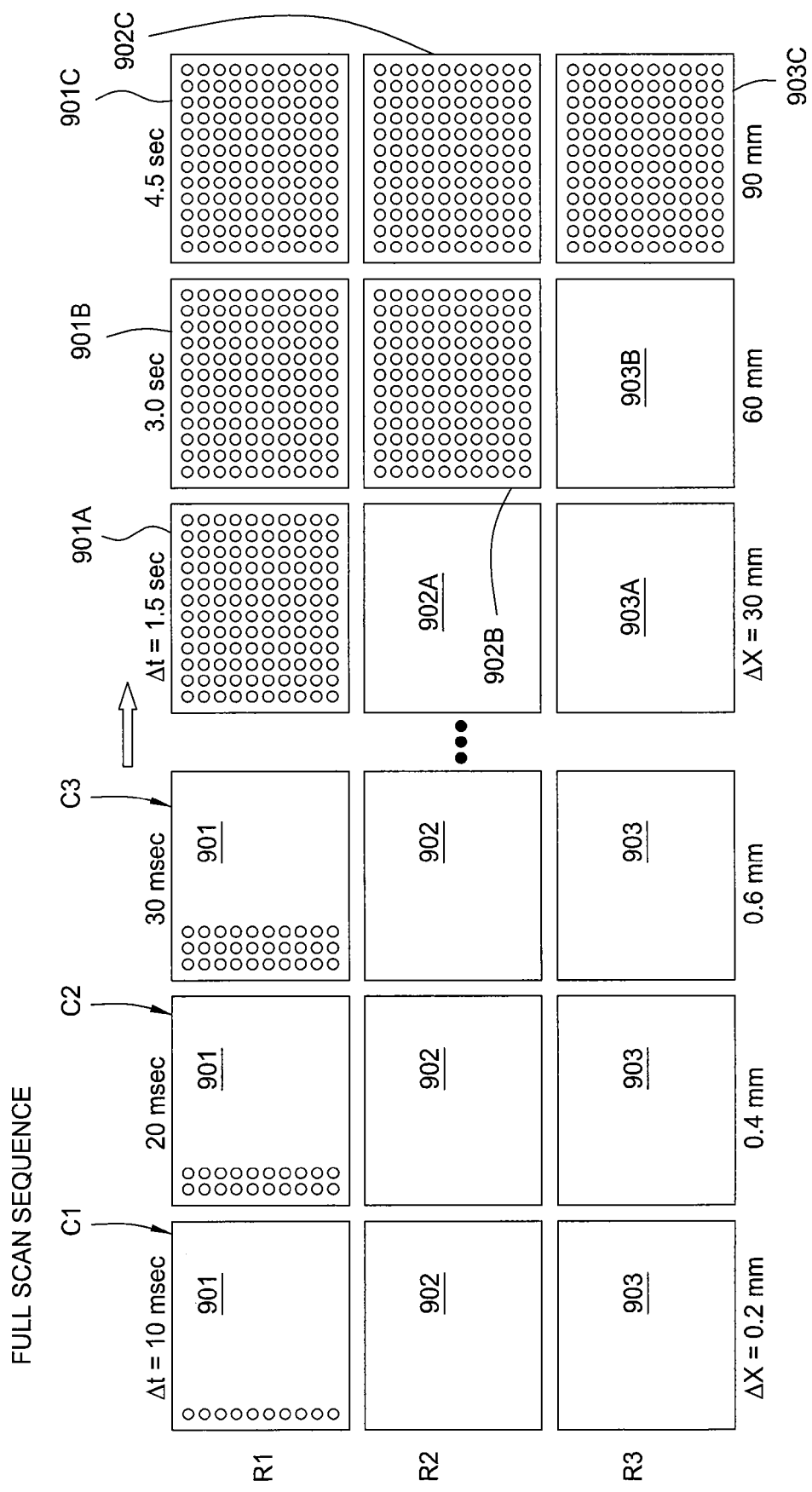
FIGS. 9a and 9b illustrate three solar cell substrates in a group being processed in a full scan mode (FIG. 9a) and a line scan mode (FIG. 9b) at different time intervals when adapting a beam switching method.
Figure 9B:
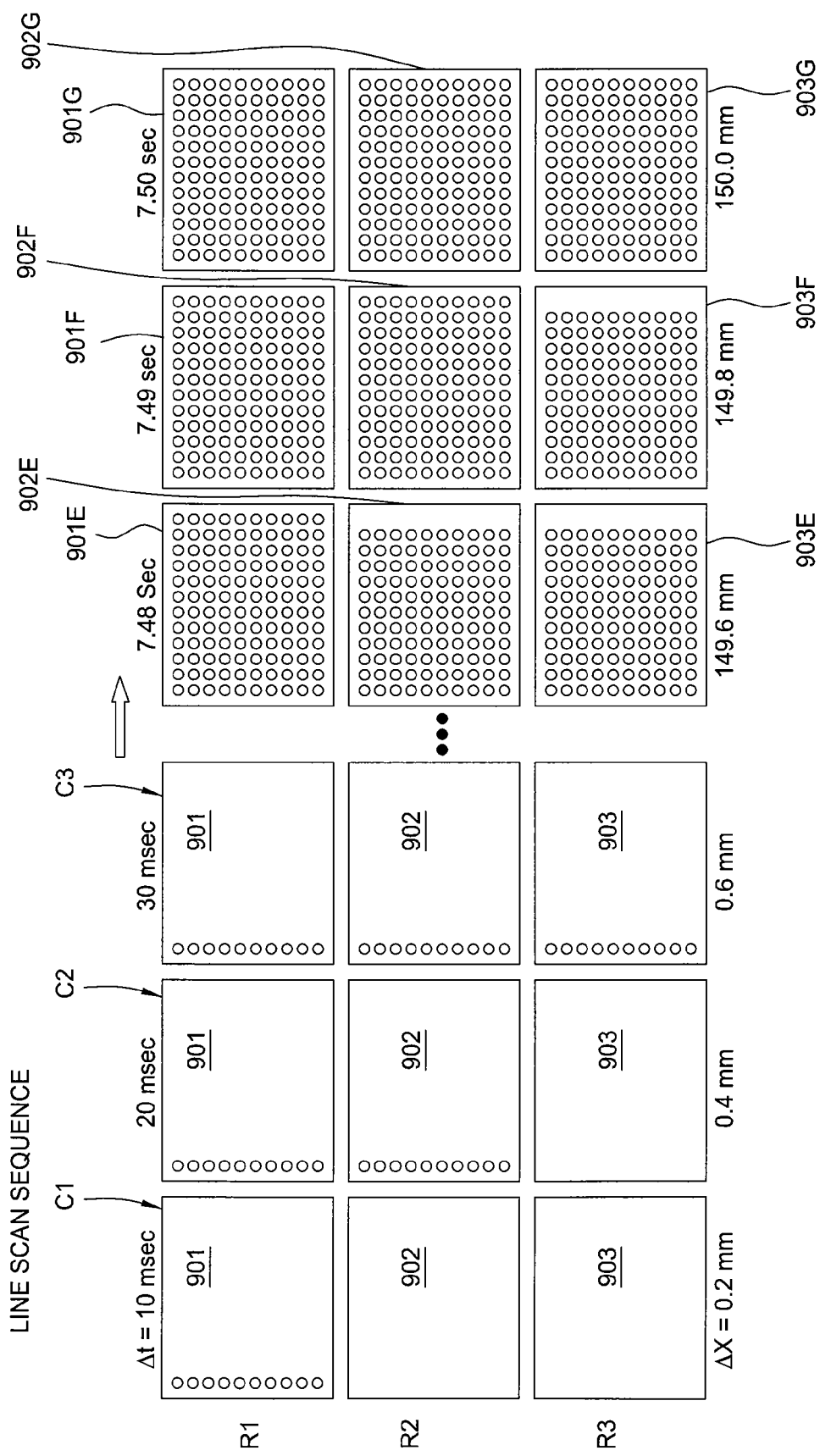

During processing, the laser beam may scan across the surface of the solar cell substrate in a full scan mode or a line scan mode. The embodiments shown in FIGS. 9*a* and 9*b* illustrate how three solar cell substrates 901-903 are processed in a full scan mode (FIG. 9*a*) or in a line scan mode (FIG. 9*b*) by a single beam of energy at different time intervals when adapting a beam switching method. It should be noted that the single beam of energy (e.g., laser beam 320) could be delivered from a single laser source or be one of the split beams of energy discussed in conjunction with FIG. 6, 7 or 8. In an example of the full scan mode shown in FIG. 9*a*, three solar cell substrates in a row are being processed at a given time interval, for example, 10 milliseconds, per line, while the carrier is conveyed at a constant speed of about 20 mm/second ($\Delta x=0.2$ mm). In one aspect, the laser beam will have scanned across a single line of the first solar cell substrate 901 after 10 msec ($\Delta t=10$ msec), as shown in the row R1, column C1. Thereafter, the laser beam will be switched, according to any of scanning concepts as described previously (e.g., a dedicated beam source concept, a beam splitting concept, or a beam switching concept such as rotational or scanning concepts), to a location immediately next or adjacent to the first line that has just finished scanning, and perform the same single line scan on the first solar cell substrate 901. After 20 msec ($\Delta t=20$ msec), the laser beam will have scanned across a second line of the first solar cell substrate as shown in the row R1, column C2. Thereafter, the laser beam will be switched again, according to any of scanning concepts as described previously, to a location immediately next or adjacent to the second line that has just finished scanning and perform the same single line scan on the first solar cell substrate 901. After 30 msec ($\Delta t=30$ msec), the laser beam will have scanned across a third line of the first solar cell substrate 901 as shown in the row R1, column C3 of FIG. 9*a*. This full-scan mode process repeats until the entire surface of the first solar cell substrate 901 in row R1 is scanned or patterned, which is about 1.5 seconds ($\Delta t=1.5$ sec) as shown in the row R1, 901A. Thereafter, the same full-scan mode process is performed on the second solar cell substrate 902 (i.e., the one that is immediately next or adjacent to the first solar cell substrate 901 in the row R2) and then the third solar cell substrate 903 (i.e., the one that is immediately next or adjacent to the second solar cell substrate 902 in the row R3) in a similar scanning sequence to the first solar cell substrate 901. This full-scan mode process repeats until the entire surface of the second solar cell substrate 902 in the row R2 and the third solar cell substrate 903 in the row R3 are scanned or patterned, which is about 3.0 seconds (as the second solar cell substrate shown in row R2, 902B) and about 4.5 seconds (as the third solar cell substrate shown in the row R3, 903C), respectively. Therefore, in the embodiment shown in FIG. 9*a*, the entire surfaces of three solar cell substrates 901-903 in that row will have been scanned in about 4.5 seconds, as a complete status of 901C, 902C, and 903C shown in the left of FIG. 9*a*. After the first three solar cell substrates are scanned, the laser beam is paused, for example, about 3.9 seconds before starting next group of the solar cell substrates. It should be noted that when temporary pausing the laser beam, the laser beam may not need to be turned off. In one aspect, the laser beam may point to a non-working area while lowering the power level of the laser beam before the next scan starts. It has been measured that the throughput of the full scan mode is about or greater than 3,850 substrates per hour. However, it is contemplated that the throughput may vary depending on the scan time intervals, scan speed, or the laser power, etc. and can be changed upon the need of processing schemes.

Alternatively, the laser beam may scan across the surface of the solar cell substrates in a line scan mode. In an example of the line scan mode shown in FIG. 9*b*, three solar cell substrates 901-903 in a row are processed at a given time interval, for example, 10 milliseconds, per line, while the carrier is conveyed at a constant speed of about 20 mm/second. In one aspect, the laser beam will have a single line scanned across the first solar cell substrate 901 in the row R1 after 10 msec ($\Delta t=10$ msec). Thereafter, the laser beam will be switched, according to any of scanning concepts as described previously (e.g., a dedicated beam source, a beam splitting concept, or a beam switching concept such as rotational or scanning concepts), to a second solar cell substrate 902 that is immediately next to or adjacent to the first solar cell 901 that has just finished scanning in row R1, column C1, and perform the same single line scan on the second solar cell substrate 902. After 20 msec ($\Delta t=20$ msec), the laser beam will have scanned across a first line of the second solar cell substrate 902 as shown in row R2, column C2. Thereafter, the laser beam will be switched again, according to any of scanning concepts as described previously, to a third solar cell substrate 903 that is immediately next or adjacent to the second solar cell substrate 902 that has just finished scanning in row R2, and perform the same single line scan on the third solar cell substrate. After 30 msec ($\Delta t=30$ msec), the laser beam will have scanned across a first line of the third solar cell substrate 903, as shown in row R3, column C3 of FIG. 9*b*.

After the first line of all three solar cell substrates in that row has been scanned, the laser beam will be switched again, according to any of scanning concepts as described previously, to the first solar cell substrate 901 and perform a second line scan at a location immediately next to the first line that had been scanned previously. Thereafter, the laser beam will be switched again to the second solar cell substrate 902 that is immediately next or adjacent to the first solar cell substrate 901 that has just finished the second line scanning, and perform a second line scan at a location immediately next to the first line that had been scanned previously. Thereafter, the laser beam will be switched again to the third solar cell substrate 903 that is immediately next or adjacent to the second solar cell substrate 902 that has just finished the second line scanning, and perform a second line scan at a location immediately next to the first line that had been scanned previously. In about 7.48 seconds, the entire surface of the first solar cell substrate 901 will have been scanned, as shown in row R1, 901E, while the last line of the second and the third solar cell substrate have not yet scanned, as shown in row R2, 902E and row R3, 903E, respectively. In about 7.49 seconds, the entire surface of the first and the second solar cell substrates 901, 902 will have been scanned, as shown in row 1, 901F and row 2, 902F, respectively, while the last line of the third solar cell substrate has not yet scanned, as shown in row R3, 903F. This line-scan process repeats until the entire surface of each solar cell substrate 901-903 in that column is patterned, which is about 7.50 seconds as a complete status of 901G, 902G, and 903G shown in the right of FIG. 9b. Similar to the full-scan mode, after the first three solar cell substrates are scanned, the laser beam is temporary paused before starting next row of the solar cell substrate. In one aspect, the laser beam may point to a non-working area while lowering the power level of the laser beam before the next scan starts. It has been measured that the throughput of the line scan mode is about 3,850 substrates per hour. However, it is contemplated that the throughput may vary depending on the scan time intervals, scan speed, or the laser power, etc. and can be changed upon the need of processing schemes.

It is believed that there are advantages to each mode of operation. For full scan mode, the advantage is that the laser beam is switched less often, so that the throughput is potentially greater than the line scan mode. The advantage of the line scan mode, on the other hand, is that the target coordinates can be positioned beyond the window, so that falling particles are less likely to land on the window.

In a line scan mode, various approaches may be adapted to reduce the number of falling particles landed on windows formed in the sealing plate that may occur during processing of the solar cell substrates. When a dedicated beam source or beam splitting method is used, a shield assembly (not shown) may be optionally provided between the sealing plate and the carrier. In such an embodiment, the shield assembly may be a thin, tilting plate that is vertical with respect to the sealing plate. In one aspect, the shield assembly extends beyond opposing edges of the sealing plate along a transverse direction of the sealing plate. The shield assembly is sized and titled at a certain angle such that the falling particles are limited to a region other than the windows of the sealing plate.

Alternatively, the window opening in the sealing plate may be a slit-like opening without having a transparent window disposed therein. In such a case, a window shield (not shown) may be provided below, or immediately below the sealing plate (i.e., within the lower region of the laser firing chamber), and sized to at least encompass the slit-like opening in order to prevent particles from falling on the lens of the laser scanning heads. In one embodiment, the window shield may contain one or more transparent windows having a surface area that is sufficiently larger enough to cover the slit-like openings in the sealing plate. In another embodiment, the slit-like openings may be offset away from a working area on the solar cell substrate. Specifically, if viewed from the side, the slit-like openings in the sealing plate is offset away from a current scanning line (i.e., the line that is being scanned or to be scanned) by about 25 mm. In such a case, the upward laser beam emitting from each laser scanning head is adjusted to tilt toward the back surface of the solar cell substrate. By performing the line scan process in the transverse direction while longitudinally moving the carrier, an appropriate offset can significantly reduce the number of falling particles landed on the lens assembly of the laser scanning heads.

In one embodiment where the window shield is used, the window shield may slide in a direction (longitude) similar to the movement of the carrier. The shape or the surface area of the window shield may be varied for different processing schemes. In one aspect, the window shield may advance by width of the slit-like opening at a constant or a pre-determined speed in order to prevent excessive particles build up on the window shield. In one embodiment, the window shield may advance by width of the slit-like opening when the exposed area of the window shield reaches a cleanliness threshold. The window shield may be periodically cleaned or replaced when it reaches its useable lifetime. In such a manner, any falling particles from the backside of the solar cell substrates will not build up on the window shield and influence the accuracy of the upward laser beams from the laser scanners, since a clean window shield is always available for each of the laser scanning head.

The above description generally illustrates various hardware concepts of laser module in processing solar cell substrates with a full laser power, in a full scan or a line scan patterning modes, while the plurality of solar cell substrates are placed in a carrier that is transported through the laser firing chamber of a deposition system. In order to improve the quality of the laser processing, the present inventors have further developed various approaches to detect and calibrate a laser beam position or position of the carrier, without manually opening the laser firing chamber.

Figure 10:
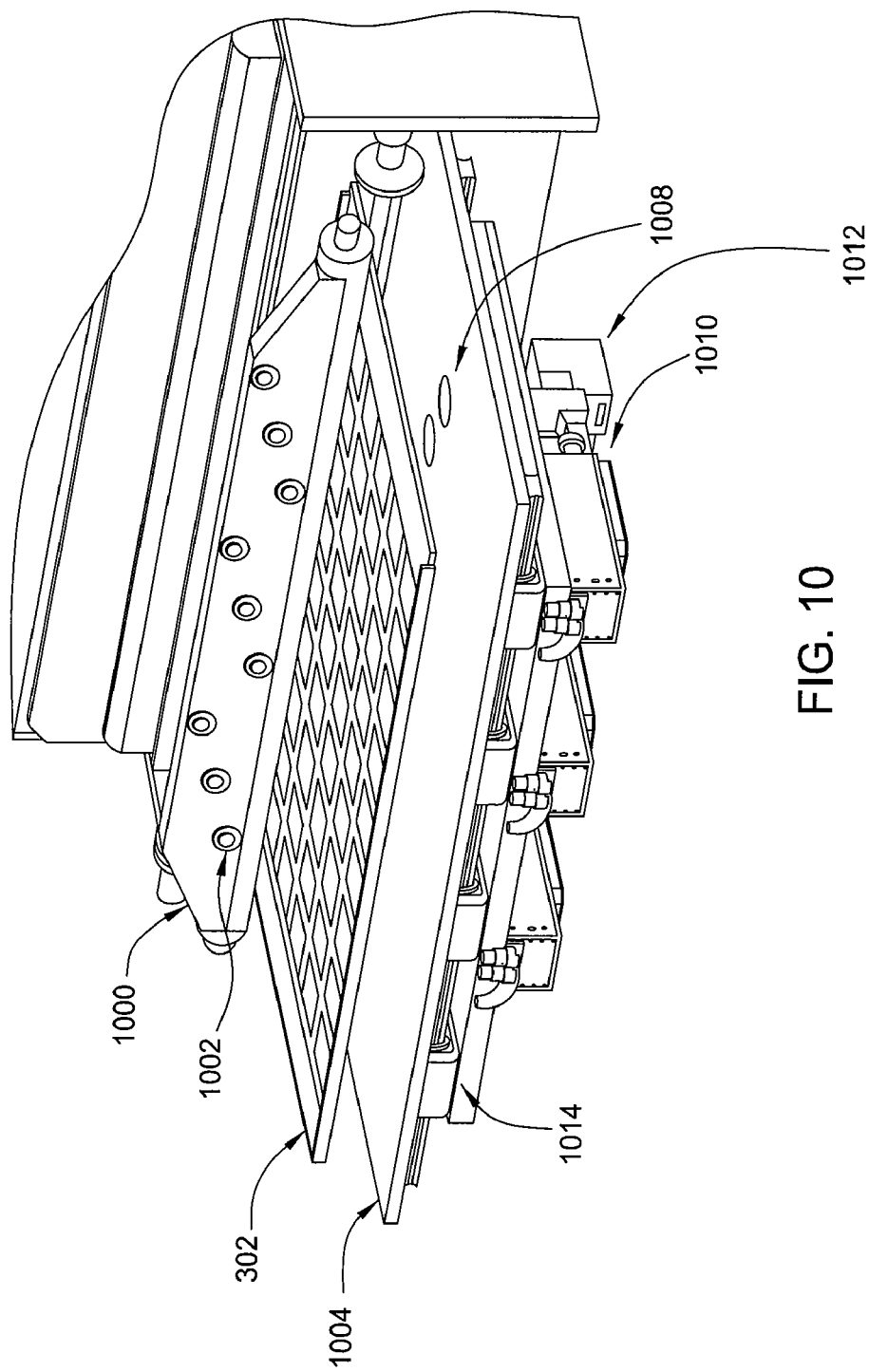
FIG. 10 illustrates a simplified diagram of an example sensor assembly for practicing a calibrating process according to one embodiment of the present invention.

FIG. 10 illustrates a simplified diagram of an example sensor assembly 1000 for practicing a calibrating process according to one embodiment of the present invention. For clarity, the chamber wall and components that might not readily relevant have been omitted. In one embodiment, the sensor assembly 1000 may be a plank-shaped or any desired-shaped body that has a plurality of sets of beam sensors 1002 disposed thereon for detecting a beam alignment error from a laser disposed in the laser module 1010, which is, for example, similar to the laser module 312, 402, 600, or 700, as discussed above. In one embodiment, the sensor assembly 1000 is located inside the laser firing chamber. In one aspect, the sensor assembly 1000 is located above the sealing plate 1004 (i.e., within the upper region of the laser firing chamber). In one aspect, the sensor assembly 1000 is located above the carrier 302 while each end of the sensor assembly 1000 is removably or magnetically coupled to an actuator (not shown) located outside the laser firing chamber. In one another aspect, each end of the sensor assembly 1000 may be pivotally coupled to the actuator such that the sensor assembly 1000, through movement of the actuator, can be flipped up to a retracted position or lowered/flipped down to a calibration position about the longitudinal axis of the sensor assembly 1000. When lowering down, the sensor assembly 1000 and the sealing plate 1004 are generally parallel to each other. In one embodiment, a block (not shown) may be provided in a manner to limit switch movement of the sensor assembly 1000 if the carrier 302 is presented.

Figure 11A:
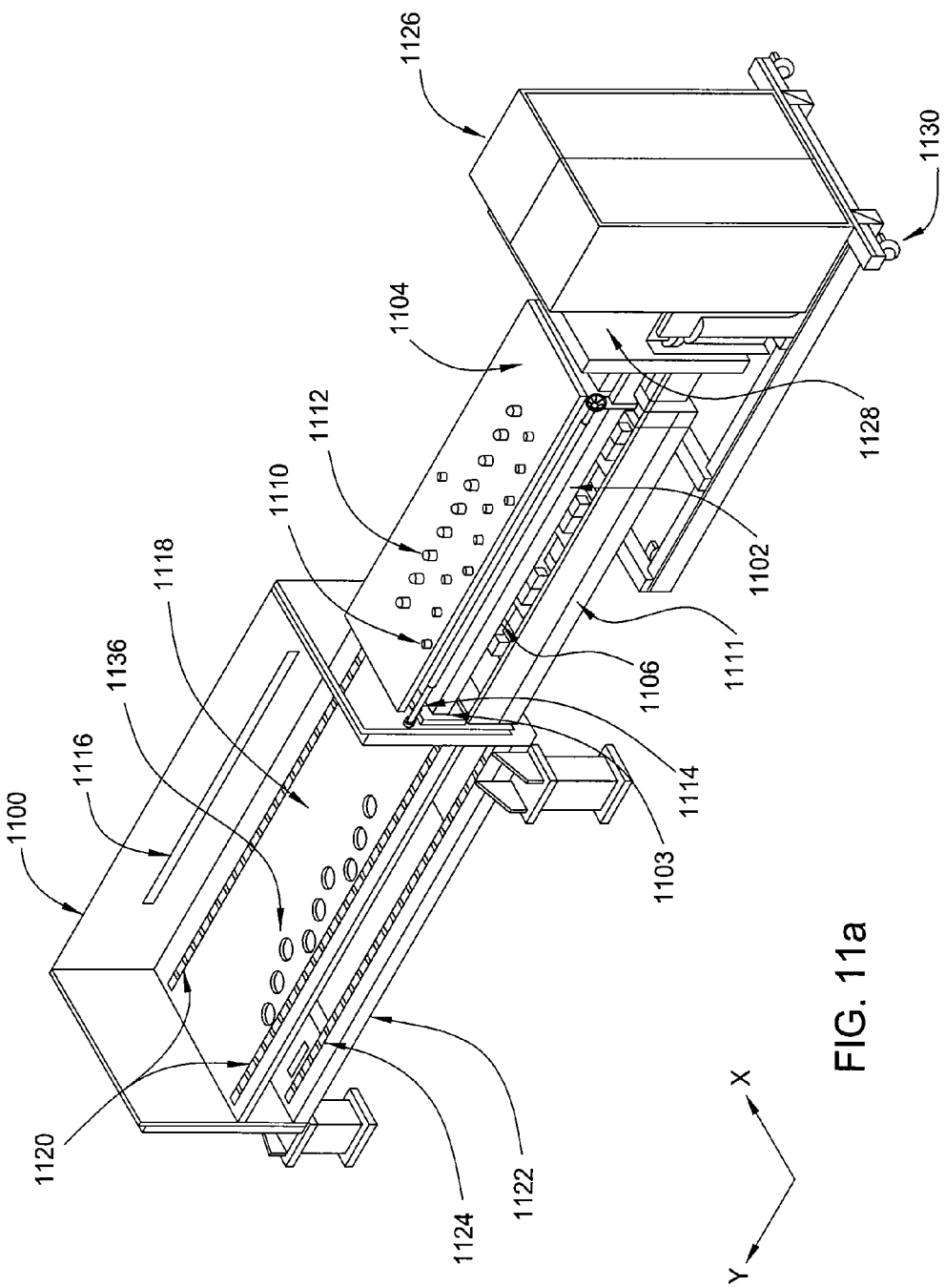
FIG. 11a depicts a prospective view of one embodiment of the laser firing chamber, showing a transport module (with a sensor assembly disposed thereon) and a laser module being pulled out together.

In one alternative embodiment shown in FIG. 11a, the sensor assembly 1104 may be a rectangular plate that is removably disposed on top of the hollow frame body 1103 of the transport module 1102, which is, for example, similar to the transport module 305 discussed above. Specifically, the sensor assembly 1104 may be located above the rollers 1114 at a desired height in order for the carrier (not shown) to convey thereunder. In one aspect, the sensor assembly 1104 and the sealing plate 1118 are generally parallel to one another. In one aspect, the height of the sensor assembly 1104 is adjustable so that it can be lowered down, when the carrier 302 is not presented, to a calibration position that is about the height of the focal plane of the laser beam. In one embodiment, the sensor assembly 1104 is shaped and sized to substantially cover an outputting region of the laser beam. It is contemplated that the sensor assembly described herein may be in any desired shape, for example, polygonal or curved, as required to match the arrangement of laser scanning heads, which is, for example, similar to laser scanning heads 606 or 710 as discussed earlier, and to properly detect the laser beam emitted from the laser scanning heads.

Referring back to FIG. 10, in order to calibrate the beam position, the beam sensors 1002 may be arranged such that each sensor 1002 corresponds to a window 1008 formed in the sealing plate 1004 as well as the laser scanning head 1012 located underneath the sealing plate 1004. During calibration, the carrier 302 is not presented, allowing the sensor assembly 1000 to lower down to a calibration position, i.e., at or near the focal plane of the laser beam to simulate the carrier. The laser module 1010 located below the sealing plate 1004 then directs the laser beams that are pulsed at a reduced power level toward the beam sensors 1002. The beam positions are detected at one or more target spots, where the beam sensors 1002 are located. The detected information is fed back to a scanner controller (not shown) in order to adjust the lens depth of focus or correct the position of the laser scanner by adjusting the movement of the supporting plate 1014 on which the laser module 1010 is mounted. In one example, the beam sensor 1002 is designed to provide information regarding the laser beam power.

In one embodiment, the sensor assembly 1104 may further contain a plurality of sets of substrate sensors 1112 (as depicted in FIG. 11a). The number and arrangement of the substrate sensor 1112 may be varied upon the number and arrangement of the solar cell substrates placed in the carrier (not shown). In one aspect, the sensor assembly 1104 generally provides nine substrate sensors 1112 arranged in a straight line along a transverse direction of the laser firing chamber 1100. The substrate sensor 1112 is designed to determine a location of the substrate surface for focal plane adjustment. In one aspect, the substrate sensor also detects the presence of the solar cell substrate. The detected information is fed back to a scanner controller so that the laser scanner can skip missing substrates. In one aspect, the substrate sensor 1112 may also monitor and adjust the motion of the carrier so that the carrier is aligned to the substrate sensor 1112. It is contemplated that the sensors described herein may be optical sensors, capacitive sensors, ultrasonic sensors, or any other suitable sensors. It is also contemplated that various sensors or devices may be further provided to calibrate parameters of the laser module or positions of the carrier. For example, in one embodiment a carrier position camera (not shown) may be provided to determine a position of the carrier relative to a reference point. In another embodiment, one or more alignment rollers (not shown) may be provided at a side of the carrier to align the carrier with the sensors. Similarly, temperature sensors, vacuum sensors, proximity sensors, safety sensors that are required to monitor the status of various process parameters and safety requirement may be employed upon needs.

For a better understanding of the present invention, FIG. 11a depicts a prospective view of one embodiment of the laser firing chamber 1100, showing a transport module 1102 having a sensor assembly 1104 disposed thereon and a laser module 1106 that have both been removed from the laser firing chamber 1100. For clarity, the chamber ceiling is omitted. In this embodiment, the sensor assembly 1104 having three sets of beam sensors 1110 and nine substrate sensors 1112 is removably disposed on the hollow frame body 1103 (e.g., similar to reference numeral 305 in FIG. 3) of the transport module 1102. Specifically, the sensor assembly 1104 longitudinally spans across two sides of the hollow frame body 1103 of the transport module 1102. In one aspect, the sensor assembly 1104 is disposed in a desired position to allow the carrier 302 (see FIG. 11b) to be conveyed below the sensor assembly 1104. The sensor assembly 1104 is adapted to calibrate the laser beam and the position of the carrier as discussed previously. In operation, the transport module 1102 is inserted into the laser firing chamber 1100 that is to be maintained in a vacuum condition. The carrier 302 having a plurality of solar cell substrates 1109 (FIG. 11b) placed therein, then travels through the laser firing chamber 1100 along a longitudinal (X) direction by one or more rollers 1114 (FIG. 11a) from, for example, an evaporation chamber (not shown) to a deposition chamber (not shown) through ports 1116 (e.g., only one shown) formed in the walls of the laser firing chamber 1100. It is contemplated that the processing chamber connecting to either side of the laser firing chamber 1100 is not intended to be limited to the processing chambers as described. Other different processing chambers such as an annealing chamber may be employed upon the need of processing schemes.

In one embodiment depicted in FIG. 11a, the transport module 1102 is designed to slide longitudinally over a sealing plate 1118 along a first pair of linear rails 1120 that is attached to the sealing plate 1118, thereby allowing the transport module 1102 to move within or out of the upper region of the laser firing chamber 1100 from a side. In one embodiment as shown, the laser module 1106 is supported by a base plate 1111, which also slides longitudinally over a bottom 1122 of the laser firing chamber along a second pair of linear rails 1124 that is attached to the bottom 1122, allowing the laser module 1106 to move within or out of the lower region of the laser firing chamber 1110. Although not shown here, it is contemplated that the laser module 1106 may be mounted to a supporting plate that is slidable over the rear side of the sealing plate 1118 (i.e., within the lower region), as discussed previously. In one aspect, the transport module 1102 and the laser module 1106 are coupled to an electronic cabinet 1126 through a sealing wall 1128, which also constitutes a side chamber wall of the laser firing chamber 1100. When rolling (via wheels 1130) the transport module 1102 and the laser module 1106 into the laser firing chamber 1100, the sealing wall 1128 seals the laser firing chamber 1100 so that the upper and the lower region of the laser firing chamber 1100 is maintained at a vacuum condition. As can be better seen in FIG. 11b, the laser module 1106 generally contains multiple laser scanning heads 1132 and laser beam sources 1134. The laser module 1106 as depicted may adapt a beam switching concept according as discussed previously. The laser module 1106 generally contains nine upward-looking laser scanning heads 1132 arranged in a staggered configuration. During process, the laser beams from these upward-looking laser scanning heads 1132 are facing up through corresponding windows 1136 (FIG. 11a) to deliver energy to portions of one or more material layers from the backside of the solar cell substrates.

Figure 11B:
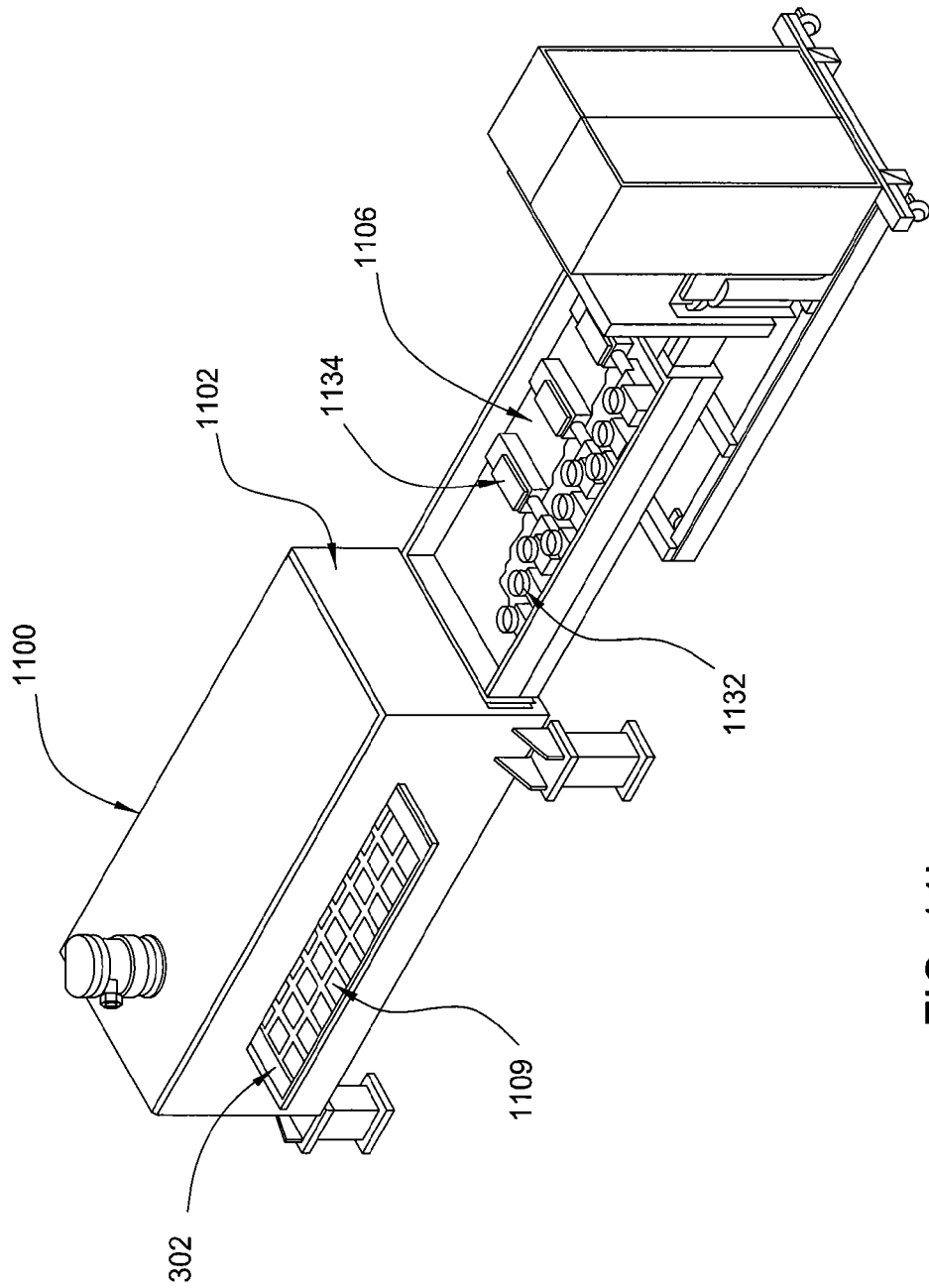
FIG. 11b illustrates a prospective view of the laser firing chamber of FIG. 11a, showing a transport module being rolled back into the laser firing chamber while the laser module is being pulled out for servicing.

FIG. 11b illustrates a prospective view of the laser firing chamber 1100 of FIG. 11a, showing a transport module 1102 has been inserted into the laser firing chamber 1100 while pulling out the laser module 1106 for servicing. As discussed previously, the laser module 1106 is designed to be able to remove or pull out from a side of the laser firing chamber 1100 without breaking the vacuum condition of the upper region, thereby reducing the risk of contaminating solar cell substrates 1109 that are placed in the carrier 302.

Figure 12:
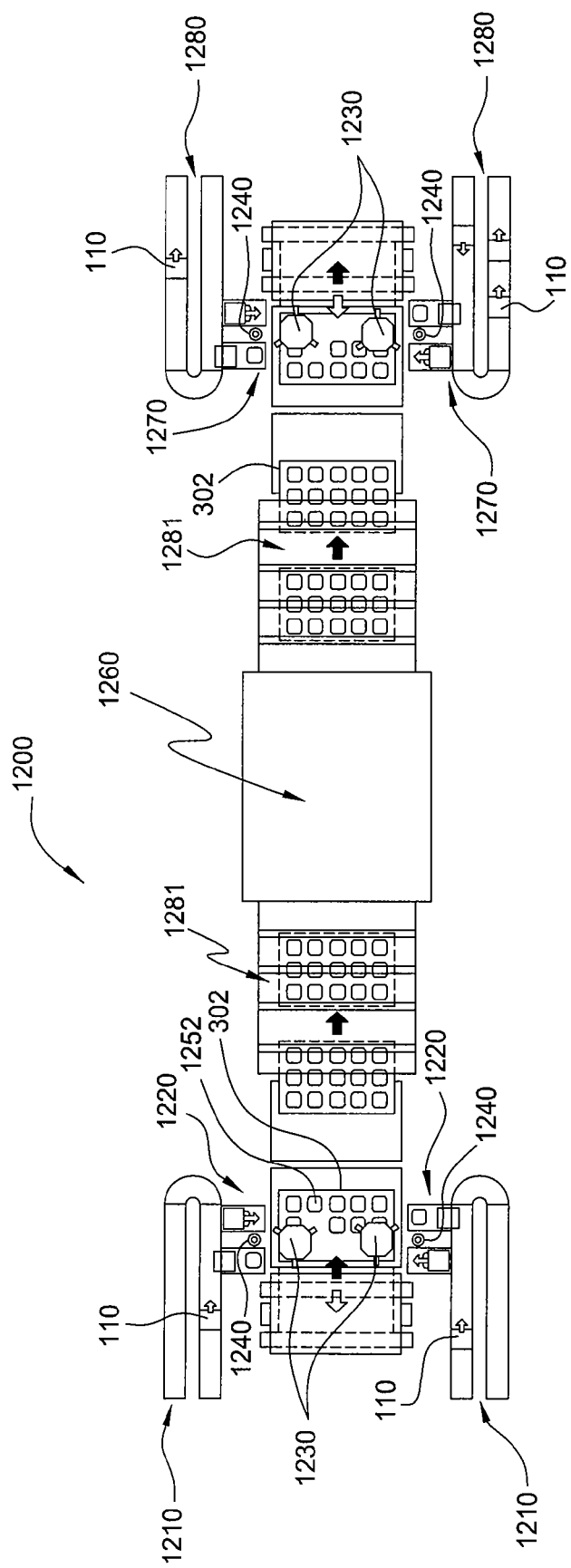
FIG. 12 illustrates a schematic plan view of a substrate handling system for processing solar cell substrates depicted in FIGS. 1a-1d or FIGS. 1e-1g according to one embodiment of the present invention.

Although the above description describes the laser processing step (i.e., the laser firing chamber) to be integrated into a horizontal in-line processing system to significantly reduce the foot print and the additional substrate handling steps, the laser processing step in some embodiments of the present invention may be integrated into a substrate handling system located in the front and/or behind the in-line processing system, as shown in FIG. 12. As nowadays the solar cell substrates are getting thinner and more fragile with each successive technology generation, it is advantageous to eliminate additional substrate handling steps to minimize the possibility of damaging to solar cell substrates. It is known that any substrate handling step has an associated breakage rate. A state-of-the-art substrate handler today may break about 0.2% of the substrates as it transfers. At typically tool throughputs of 3000 substrates per hour, such a breakage rate equals to a broken substrate in every 10 minutes. Therefore, in addition to incorporating the laser processing step inside the processing system, the present inventors have developed various approaches to integrate the laser processing step directly with a substrate handling system immediately before or after the processing system, realizing the laser processing step with a minimum number of substrate handing steps.

FIG. 12 illustrates a schematic plan view of a substrate handling system 1200 for processing solar cell substrates depicted in FIGS. 1*a*-1*d* or FIGS. 1*e*-1*g* according to one embodiment of the present invention. In one embodiment, a plurality of solar cell substrates 110 having a dielectric layer 111 deposited on the back surface 120 thereof are transported into an input region 1220 via an incoming conveyor 1210. In one embodiment, the solar cell substrates 110 are individually transported in a cassette such that the underside of the solar cell substrate is completely unobstructed. In one embodiment, once each individual substrate 110 is delivered into the input region 1220, a transfer robot 1230 may retrieve each solar cell substrate 110 from the input region 1220 and hold the substrate 110 over a laser processing system 1240 to scan a desired pattern on the backside of the solar cell substrates 110.

In one embodiment, as the transfer robot 1230 holds the substrate 110 over the laser processing system 1240, an inspection device and an illumination source may work in conjunction with a system controller 201 to determine the precise position of the solar cell substrate 110 with respect to a laser scanner disposed within the laser processing system 1240. In one aspect, the inspection device may be in communication with a system controller 201 configured to determine the offset of the solar cell substrate 110 with respect to the laser scanner. In one aspect, the system controller is configured to move the transfer robot to correct for the offset. In one example, the inspection device is a camera, such as a color or black and white camera. In one aspect, the illumination source is a light emitting diode (LED) source configured to emit light in a specified wavelength range. In another aspect, the illumination source may comprise a broadband lamp and one or more filters for emitting desired wavelengths of light toward the solar cell substrate 110. Upon the feedback, the system controller then moves the robot to correct for the offset. The laser processing system 1240 here generally contains a laser module, for example, similar to one of the laser module 312, 402, 600, 700, 800 or 1010, as discussed previously. Depending on the processing scheme, the laser scanner then removes portions of the dielectric layer 111 in a desired pattern as shown in FIG. 1*f* above.

The transfer robot 1230 then places the patterned substrate 110 into a specified pocket 1252 in a carrier 302. In one embodiment, a measurement may be used to precisely position the solar cell substrate 110 into a specified pocket 1252 in the carrier 302 by way of the robot 1230. After each of the pockets 1252 of the carrier 302 are filled with patterned solar cell substrates 110, the carrier 302 is transported into an in-line processing system 1260, which may contain one or more processing chambers such as a CVD or PVD chamber, via an automation device 1281. In one embodiment, the automation device 1281 may contain rollers (not shown) or a conveying belt (not shown) for linearly conveying the carrier 302 into the in-line processing system 1260. Depending on the processing scheme, a conducting layer 114 may be deposited over the patterned dielectric layer 111 in the in-line processing system 1260, as shown in FIG. 1*g* above.

The above describes integrating the laser processing step immediately before an in-line processing system 1260. Depending on the processing scheme, it is contemplated that the same laser processing step may be used in reverse at the exit of the in-line processing system 1260, i.e., integrating the laser processing step immediately after the in-line processing system 1260 as depicted on right side of FIG. 12. In such an embodiment, a dielectric layer 111 and a conducting layer 114 are sequentially deposited on the back surface of the substrate 110 in the in-line processing system 1260, following by a laser processing step which will heat the conducting layer 114 to drive it through the dielectric layer 111, so that it can make good electrical contact with the surface 110A of the substrate 110 as shown in FIG. 1*d* above. Thereafter, the robot 1230 then places the solar cell substrate 110 into an exit region 1270, where it may them be transported away from the substrate handling system 1200 on an outgoing conveyor 1280.

The embodiment illustrated in FIG. 12 allows for a relatively simple laser beam source design since the laser operating area is limited to the size of a single substrate 110. Additionally, the potential for substrate breakage is minimized since each substrate is only moved by the transport robot 1230 once on the pre-deposition side and once on the post-deposition side of the in-line processing system 1260.

Figure 13:
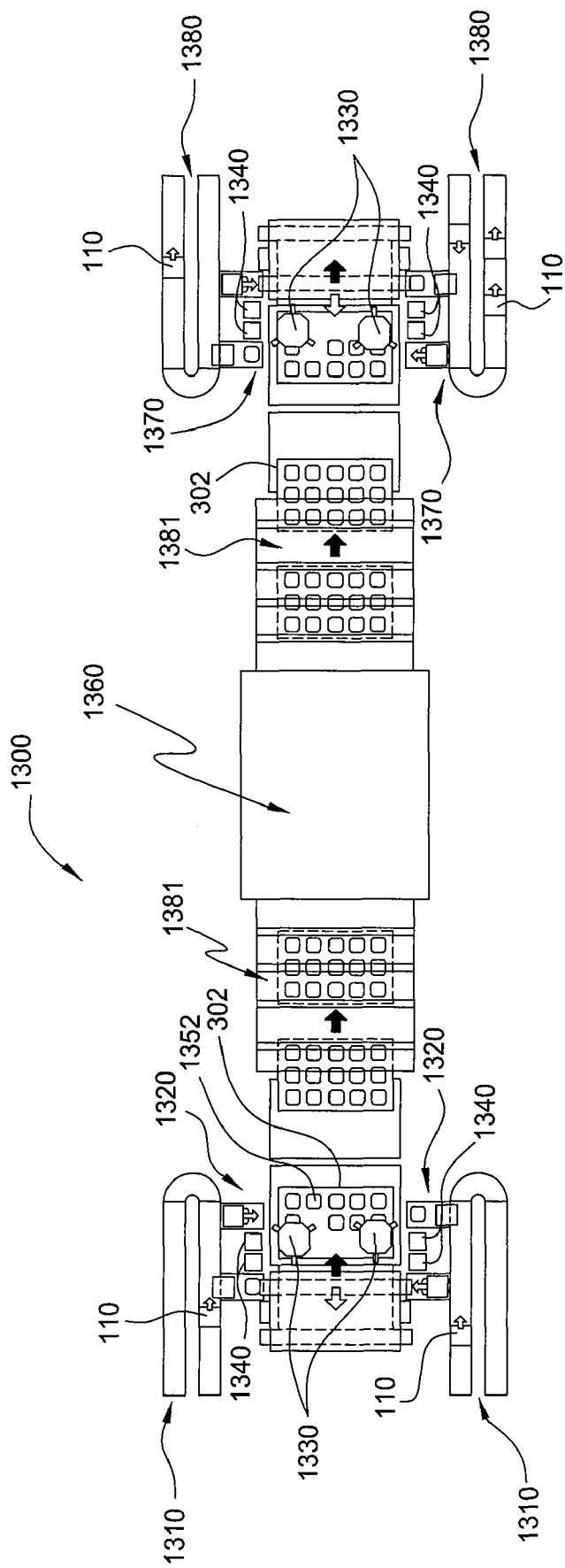
FIG. 13 is a schematic plan view of an apparatus for processing solar cell substrates depicted in FIGS. 1a-1d or FIGS. 1e-1g according to another embodiment of the present invention.

FIG. 13 is a schematic plan view of an apparatus 1300 for processing solar cell substrates depicted in FIGS. 1*a*-1*d* or FIGS. 1*e*-1*g* according to another embodiment of the present invention. In one embodiment, the solar cell substrates 110 having a dielectric layer 111 deposited on the back surface 120 thereof are transported into an input region 1320 via an incoming conveyor 1310. In one embodiment, the solar cell substrates 110 are individually transported on the incoming conveyor 1310. In another embodiment, the solar cell substrates 110 are transported in a cassette such that the underside of the substrate is completely unobstructed. In one embodiment, once each individual substrate 110 is delivered into the input region 1320, a transfer robot 1330 may retrieve the substrate 110 from the input region 1320 and place the substrate 110 onto a substrate holder 1340.

In one embodiment, the substrate holder 1340 generally contains a substrate pocket (not shown) and an upward-looking laser scanner (not shown) positioned beneath the substrate pocket, such as one of the laser modules discussed above (e.g., laser module 312, 402, 600, 700, 800 or 1010). The laser scanner then removes portions of the dielectric layer 111 in a desired pattern as shown in FIG. 1*f* above. In one embodiment, while one substrate 110 is being patterned in one substrate pocket of the substrate holder 1340, another (already patterned) substrate 110 may be removed from an adjacent substrate pocket and/or a third substrate 110 may be loaded onto the adjacent substrate pocket.

The transfer robot 1330 then places the patterned substrate 110 into a specified pocket 1352 in a carrier 302. After each of the pockets 1352 of the carrier 302 are filled with patterned solar cell substrates 110, the carrier 302 is transported into an in-line processing system 1360, which may contain one or more processing chambers such as a CVD or PVD chamber, via an automation device 1381. In one embodiment, the automation device 1381 includes rollers (not shown) or a conveying belt (not shown) for linearly transporting the carrier 302. Depending on the processing scheme, a conducting layer 114 may be deposited over the patterned dielectric layer 111 in the in-line processing system 1360, as shown in FIG. 1g above.

The above describes another embodiment of integrating the laser processing step immediately before an in-line processing system 1360. Depending on the processing scheme, it is contemplated that the same laser processing step may be used in reverse at the exit of the in-line processing system 1360, i.e., integrating the laser processing step immediately after the in-line processing system 1360 as depicted on right side of FIG. 13. In such an embodiment, a dielectric layer 111 and a conducting layer 114 are sequentially deposited on the back surface of the substrate 110 in the in-line processing system 1360, following by a laser processing step which will heat the conducting layer 114 to drive it through the dielectric layer 111 so that it can make good electrical contact with the surface 110A of the substrate 110, as shown in FIG. 1d above. Thereafter, the robot 1330 then places the substrate 110 into an exit region 1370, where it may then be transported away from the apparatus 1300 on an outgoing conveyor 1380.

The embodiment illustrated in FIG. 13 allows for a relatively simple laser beam source design since the laser operating area is limited to the size of two solar cell substrates 110. Additionally, increased substrate throughput of the apparatus 1300 may be achieved since the transfer robot 1330 may be loading/unloading one substrate 110 while an adjacent substrate 110 is being laser patterned.

Figure 14:
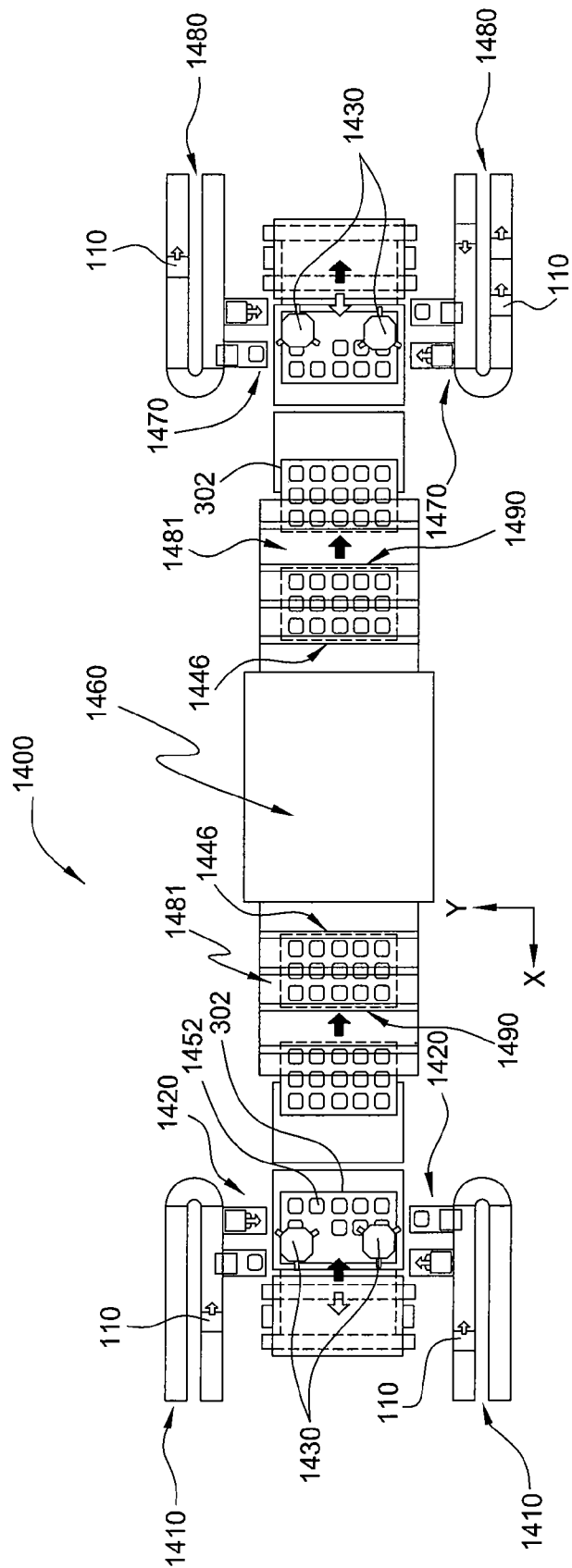
FIG. 14 is a schematic plan view of an apparatus for processing solar cell substrates as shown in FIGS. 1a-1d or FIGS. 1e-1g according to one another embodiment of the present invention.

FIG. 14 is a schematic plan view of an apparatus 1400 for processing solar cell substrates as shown in FIGS. 1a-1d or FIGS. 1e-1g according to one another embodiment of the present invention. In one embodiment, the solar cell substrates 110 having a dielectric layer 111 deposited on the back surface 120 thereof are transported into an input region 1420 via an incoming conveyor 1410. In one embodiment, the solar cell substrates 110 are individually transported on the incoming conveyor 1410. In another embodiment, the solar cell substrates 110 are transported in a cassette such that the underside of the substrate is completely unobstructed. In one embodiment, once each individual substrate 110 is delivered into the input region 1420, a transfer robot 1430 may retrieve the substrate 110 from the input region 1420 and place the substrate 110 into a specified pocket 1452 in a carrier 302 by way of the transfer robot 1430. After each of the pockets 1452 of the carrier 302 are filled with patterned solar cell substrates 110, the carrier 302 is transported, via an automation device 1481, over a laser processing system 1446 to scan a desired pattern on the backside of the solar cell substrates 110. Depending on the processing scheme, the laser processing system then removes portions of the dielectric layer 111 in a desired pattern as shown in FIG. 1f above.

In one embodiment, the laser processing system 1446 generally contains one or more laser scanners (not shown), such as described above in conjunction with FIGS. 4-8. In one embodiment, the laser scanner is configured to move in the Y direction. In such an embodiment, the carrier 302 is indexed one row at a time, via the automation device 1481, over the laser scanner for patterning each substrate 110 in the respective row. In another embodiment, the laser scanner is configured to move in the X and Y directions, in a manner as described previously.

In the embodiment shown in FIG. 14, the apparatus 1400 may include a vision system 1490 for determining the precise positioning of the substrate transport surface with respect to the laser scanner. The exact position of the substrate transport surface may be determined using the vision system 1490 and one or more fiducial marks formed on the substrate transport surface. The vision system 1490 may include one or more detectors that are positioned to view the fiducial marks found on the substrate transport surface. The position and angular orientation of the substrate transport surface with respect to the known position of the laser scanner can then be determined by a system controller. This offset may then be used to precisely position the laser scanner for patterning the dielectric layer 111 of each substrate 110. In addition, the vision system 1490 may be used to inspect the patterned dielectric layer 111 of each substrate 110.

After patterning the dielectric layer 111 of each substrate 110 on the carrier 302, the carrier 302 is transported into an in-line processing system 1460, which may contain one or more processing chambers such as an evaporation chamber, a CVD or PVD chamber, via an automation device 1481. In the in-line processing system 1460, the conducting layer 114 is deposited over the patterned dielectric layer 111 of each substrate 110 as shown in FIG. 1g above.

The above describes integrating the laser processing step immediately before an in-line processing system 1460. Depending on the processing scheme, it is contemplated that the same laser processing step may be used in reverse at the exit of the in-line processing system 1460, i.e., integrating the laser processing step immediately after the in-line processing system 1460 as depicted on right side of FIG. 14. In such an embodiment, a dielectric layer 111 and a conducting layer 114 are sequentially deposited on the back surface of the substrate 110 in the in-line processing system 1460, following by a laser processing step which will heat the conducting layer 114 and drive it through the dielectric layer 111 so that it can make good electrical contact with the surface 110A of the substrate 110, as shown in FIG. 1d above. Thereafter, the robot 1430 may remove each substrate 110 from its respective pocket 1452 in the carrier 302 and place the substrate 110 into an exit region 1470, where it may then be transported away from the apparatus 1400 on an outgoing conveyor 1480.

The embodiment illustrated in FIG. 14 provides for extremely precise positioning of the laser patterns on layers of the solar cell substrate 110 since each individual substrate 110 may be located with respect to the coordinate system of the laser processing system 1446 and/or each carrier 302 may be located with respect to the coordinate system of the laser processing system 1446. Additionally, the embodiment of FIG. 14 does not affect the substrate throughput of the transfer robot 1430 since all patterning processes are performed after loading and/or prior to unloading of the solar cell substrates 110.

The above describes various embodiments of processing solar cell substrates by integrating a laser processing step into an in-line processing system, integrating directly with a substrate handling system immediately before or after the in-line processing system, allowing the laser processing step performed with a substrate handler of a substrate handling system. Therefore, the number of additional substrate handing steps is minimized. In contrast, a conventional standalone laser tool would require the substrates to be removed from their cassette for laser processing, placed back into their cassettes after processing, and then re-handled after the cassette arrives at the next tool for other processing step such as a deposition process, which increases the chance of substrate breakage, increases the chances of creating defects in the formed layers due to the increased number of transferring steps, and increases the solar cell processing cost and complexity. Another advantage of the present invention is that the queue time between a laser firing process and a metal deposition process is quite short or even eliminated. Therefore, a native oxide or other layer will not form in the freshly created holes to degrade the interface between the silicon and deposited metal, since the fired contact holes are filled immediately after the holes are formed.

While the foregoing is directed to embodiments of the present invention, other and further embodiments of the invention may be devised without departing from the basic scope thereof, and the scope thereof is determined by the claims that follow.

What is claimed is:

1. A method for processing silicon-containing substrates in a processing system, comprising:
   transferring a plurality of silicon-containing substrates having a dielectric layer deposited thereon through a deposition chamber to deposit a conducting layer over the dielectric layer; and
   transferring the plurality of silicon-containing substrates having the dielectric layer and the conducting layer deposited thereon through a laser firing chamber to process the plurality of silicon-containing substrates by directing multiple laser beams over the entire surface of the plurality of silicon-containing substrates simultaneously in a desired pattern, thereby diffusing the conducting layer through the dielectric layer into the silicon-containing substrates.

2. The method of claim 1, further comprising:
   transferring the processed silicon-containing substrates to a sputtering chamber to deposit a conductive contact layer over the conducting layer of the plurality of silicon-containing substrates.

3. The method of claim 1, further comprising:
   prior to depositing a conducting layer over the dielectric layer of the plurality of silicon-containing substrates, transferring the plurality of silicon-containing substrates having the dielectric layer deposited thereon through a laser processing chamber to process the plurality of silicon-containing substrates by delivering energy to the dielectric layer of the plurality of silicon-containing substrates, thereby forming one or more exposed regions on the dielectric layer of the plurality of silicon-containing substrates.

4. The method of claim 3, further comprising:
   transferring the processed silicon-containing substrates having one or more exposed regions to a sputtering chamber to deposit a conductive contact layer over one or more exposed regions of the silicon-containing substrates.

5. The method of claim 1, further comprising:
   transferring the processed silicon-containing substrates to an annealing chamber for heat treatment of the processed silicon-containing substrates.

6. The method of claim 2, further comprising:
   positioning the plurality of silicon-containing substrates into at a plurality of positions located in a carrier, wherein at least two of the plurality of positions have one silicon-containing substrate disposed therein and a backside of the plurality of silicon-containing substrates is completely unobstructed; and
   transporting the carrier through the deposition chamber, the laser processing chamber, and the sputtering chamber within the processing system.

7. The method of claim 6, wherein processing the plurality of silicon-containing substrates comprises upwardly providing multiple laser beams toward two or more silicon-containing substrates simultaneously from the backside of the plurality of silicon-containing substrates.

8. The method of claim 7, wherein processing the plurality of silicon-containing substrates comprises longitudinally or latitudinally moving multiple laser beams relative to the carrier.

9. The method of claim 8, wherein processing the plurality of silicon-containing substrates comprises moving multiple laser beams while transporting the carrier.

10. The method of claim 7, wherein processing the plurality of silicon-containing substrates comprises moving multiple laser beams relative to the carrier in the following manner:
    directing the laser beams to scan an entire surface of one silicon-containing substrate before the laser beam is switched to the next silicon-containing substrate adjacent thereto, and the processing repeats until the entire surface of each silicon-containing substrate in the carrier is scanned.

11. The method of claim 7, wherein processing the plurality of silicon-containing substrates comprises moving multiple laser beams relative to the carrier in the following manner:
    directing the laser beam to scan across a first single line of a first silicon-containing substrate and then switching to a second silicon-containing substrate adjacent to the first silicon-containing substrate to perform the same single line scanning on the adjacent second silicon-containing substrate,
    after a set of lines is scanned on a desired number of the silicon-containing substrates in a group, directing the laser beam back to the first silicon-containing substrate in that group to scan across a second single line immediately next to the first single line on the first silicon-containing substrate, the laser beam then switches to the second silicon-containing substrate adjacent to the first silicon-containing substrate to scan a second single line immediately next to the first single line on the second silicon-containing substrate,
    the laser beam continues to process all the silicon-containing substrates in that group in the same sequence until the entire surface of each silicon-containing substrate in the carrier is scanned.

12. The method of claim 9, wherein processing the plurality of silicon-containing substrates comprises guiding multiple laser beams through multiple laser beam scanners to the plurality of silicon-containing substrates.

13. The method of claim 12, wherein the multiple laser beam scanners are arranged flush with one another or in a staggered configuration.

14. The method of claim 12, wherein guiding multiple laser beams to multiple laser beam scanners further comprising:
    guiding the laser beam to a first adjustable mirrors, the first adjustable mirror being rotatable around an X axis;
    reflecting the laser beam from the first adjustable mirror to a second adjustable mirror, the second adjustable mirror being rotatable around Y axis; and
    reflecting the laser beam from the second adjustable mirror to the laser beam scanner; and
    independently and continuously rotating the first and the second adjustable mirrors at a desired angle to direct the laser beam through the laser beam scanner to various positions of the silicon-containing substrate.

15. The method of claim 12, wherein guiding multiple laser beams to multiple laser beam scanners further comprising:
arranging a pair of mirrors symmetrically spaced-apart from one another at an oblique angle relative to a central axis of an incident laser beam;
arranging a first adjustable mirror at a first side of the pair of mirrors;
arranging a second adjustable mirror at a second side of the pair of mirrors, the second side being opposite to the first side; and
rotating the pair of mirrors simultaneously such that the incident laser beam is directed to one of the laser beam scanners by: (i) traveling directly through a gap between the pair of mirrors when holding the pair of mirror at 0 degree; (ii) reflecting via the pair of mirrors to the first adjustable mirror when rotating the pair of mirror at a first desired angle; or (iii) reflecting via the pair of mirrors to the second adjustable mirror when rotating the pair of mirror at a second desired angle.

16. The method of claim 1, wherein depositing the conducting layer over the dielectric layer comprises sputtering a source of the conducting layer, or evaporating a source of the conducting layer from a bottom of the depositing chamber upwardly toward the plurality of silicon-containing substrates.

17. A method for processing a substrate in a processing system, comprising:
transferring a plurality of substrates through a depositing chamber located within the processing system to deposit a material layer over the substrate;
transferring the plurality of the substrates having the material layer deposited thereon through a laser firing chamber located within the processing system;
determining a laser ablation threshold of the material deposited on the substrate;
altering either a position of the substrate or parameters of a laser by defocusing the laser such that a portion of energy emitted from the laser strikes the substrate beneath the ablation threshold; and
ablating the material without damaging the underlying substrate.

18. A method for processing a substrate in a processing system, comprising:
transferring a plurality of substrates through a depositing chamber located within the processing system to deposit a dielectric layer on a surface of the substrate;
transferring the plurality of the substrates having the dielectric layer through a laser firing chamber located within the processing system;
detecting an actual position of the substrate having the dielectric material deposited thereon;
determining an offset of the actual position with respect to an expected position of the substrate;
adjusting a first laser based on the offset;
removing a portion of the dielectric material in a desired pattern from the surface of the substrate via the first laser;
moving the substrate into a deposition chamber;
depositing a conducting layer over the patterned dielectric layer;
adjusting a second laser based on the offset; and
removing a portion of the conducting layer in a desired pattern via the second laser.

19. The method of claim 18, wherein removing a portion of the dielectric material comprises positioning the substrate such that a portion of energy emitted from the first laser strikes the substrate beneath the ablation threshold while the portion of the dielectric material is removed without damaging the underlying substrate.

20. The method of claim 18, wherein removing a portion of the dielectric material comprises thermally stressing the portion of the dielectric material by focusing light on the portion and physically removing the portion of the dielectric material without evaporating the dielectric material.

* * * * *

UNITED STATES PATENT AND TRADEMARK OFFICE
CERTIFICATE OF CORRECTION

| | | |
|---|---|---|
| PATENT NO. | : 8,173,473 B2 | Page 1 of 1 |
| APPLICATION NO. | : 12/891525 | |
| DATED | : May 8, 2012 | |
| INVENTOR(S) | : Aqui et al. | |

It is certified that error appears in the above-identified patent and that said Letters Patent is hereby corrected as shown below:

In the Claims:

Column 29, Claim 6, Line 63, please delete "into".

Signed and Sealed this
Twenty-eighth Day of August, 2012

David J. Kappos
*Director of the United States Patent and Trademark Office*